US012586648B2

(12) United States Patent
　　Takekida

(10) Patent No.:　US 12,586,648 B2
(45) Date of Patent:　　Mar. 24, 2026

(54) MEMORY DEVICE

(71) Applicant: Kioxia Corporation, Tokyo (JP)

(72) Inventor: Hideto Takekida, Nagoya Aichi (JP)

(73) Assignee: Kioxia Corporation, Tokyo (JP)

( * ) Notice: Subject to any disclaimer, the term of this patent is extended or adjusted under 35 U.S.C. 154(b) by 174 days.

(21) Appl. No.: 18/632,304

(22) Filed: Apr. 11, 2024

(65) Prior Publication Data

US 2024/0257879 A1　　Aug. 1, 2024

Related U.S. Application Data

(63) Continuation of application No. PCT/JP2021/045583, filed on Dec. 10, 2021.

(51) Int. Cl.
| | |
|---|---|
| *G11C 16/24* | (2006.01) |
| *G11C 5/06* | (2006.01) |
| *G11C 16/04* | (2006.01) |
| *G11C 16/14* | (2006.01) |
| *G11C 16/26* | (2006.01) |
| *H10B 41/10* | (2023.01) |
| *H10B 41/27* | (2023.01) |

(Continued)

(52) U.S. Cl.
CPC ............. *G11C 16/14* (2013.01); *G11C 5/063* (2013.01); *G11C 16/0483* (2013.01); *G11C 16/26* (2013.01); *H10B 41/10* (2023.02); *H10B 41/27* (2023.02); *H10B 43/10* (2023.02); *H10B 43/27* (2023.02); *H10B 51/10* (2023.02); *H10B 51/20* (2023.02); *H10D 30/701* (2025.01); *G11C 16/24* (2013.01)

(58) Field of Classification Search
CPC ...................................................... G11C 16/24
See application file for complete search history.

(56) References Cited

U.S. PATENT DOCUMENTS

| | | |
|---|---|---|
| 10,672,484 B2 | 6/2020 | Cernea |
| 11,069,704 B2 | 7/2021 | Lai et al. |

(Continued)

FOREIGN PATENT DOCUMENTS

| | | |
|---|---|---|
| JP | 2013535102 A | 9/2013 |
| JP | 2021503683 A | 2/2021 |

(Continued)

OTHER PUBLICATIONS

International Search Report (ISR) (and English language translation thereof) dated Mar. 8, 2022 issued in International Application No. PCT/JP2021/045583.

(Continued)

*Primary Examiner* — Jason Lappas
(74) *Attorney, Agent, or Firm* — Holtz, Holtz & Volek PC

(57)　　　　　ABSTRACT

According to one embodiment, a memory device includes: a first semiconductor layer, a first conductive layer, a second semiconductor layer, and a second conductive layer that are arranged in this order in a first direction, spaced apart from each other; a first semiconductor film extending in the first direction, being in contact with the first semiconductor layer and the second semiconductor layer, and intersecting the first conductive layer and the second conductive layer; a first memory film provided between the first conductive layer and the first semiconductor film; and a second memory film provided between the second conductive layer and the first semiconductor film.

19 Claims, 20 Drawing Sheets

(51) Int. Cl.
    *H10B 43/10*       (2023.01)
    *H10B 43/27*       (2023.01)
    *H10B 51/10*       (2023.01)
    *H10B 51/20*       (2023.01)
    *H10D 30/69*       (2025.01)

(56)              References Cited

U.S. PATENT DOCUMENTS

| | | |
|---|---|---|
| 11,342,381 B2 | 5/2022 | Yano |
| 2005/0185499 A1 | 8/2005 | Fujiwara et al. |
| 2008/0144377 A1 | 6/2008 | Watanabe et al. |
| 2011/0292732 A1* | 12/2011 | Ha .......................... G11C 16/24 |
| | | 365/185.25 |
| 2011/0297912 A1 | 12/2011 | Samachisa et al. |
| 2017/0077118 A1 | 3/2017 | Cheng et al. |
| 2019/0296039 A1 | 9/2019 | Maeda et al. |
| 2020/0219572 A1 | 7/2020 | Harari |
| 2021/0091108 A1 | 3/2021 | Naruke et al. |
| 2021/0091111 A1 | 3/2021 | Yabuki |
| 2021/0305273 A1 | 9/2021 | Lee et al. |
| 2021/0313340 A1 | 10/2021 | Okajima |

FOREIGN PATENT DOCUMENTS

| | | | |
|---|---|---|---|
| JP | 2021111634 A | 8/2021 | |
| WO | 03028111 A1 | 4/2003 | |

OTHER PUBLICATIONS

Written Opinion dated Mar. 8, 2022 issued in International Application No. PCT/JP2021/045583.

* cited by examiner

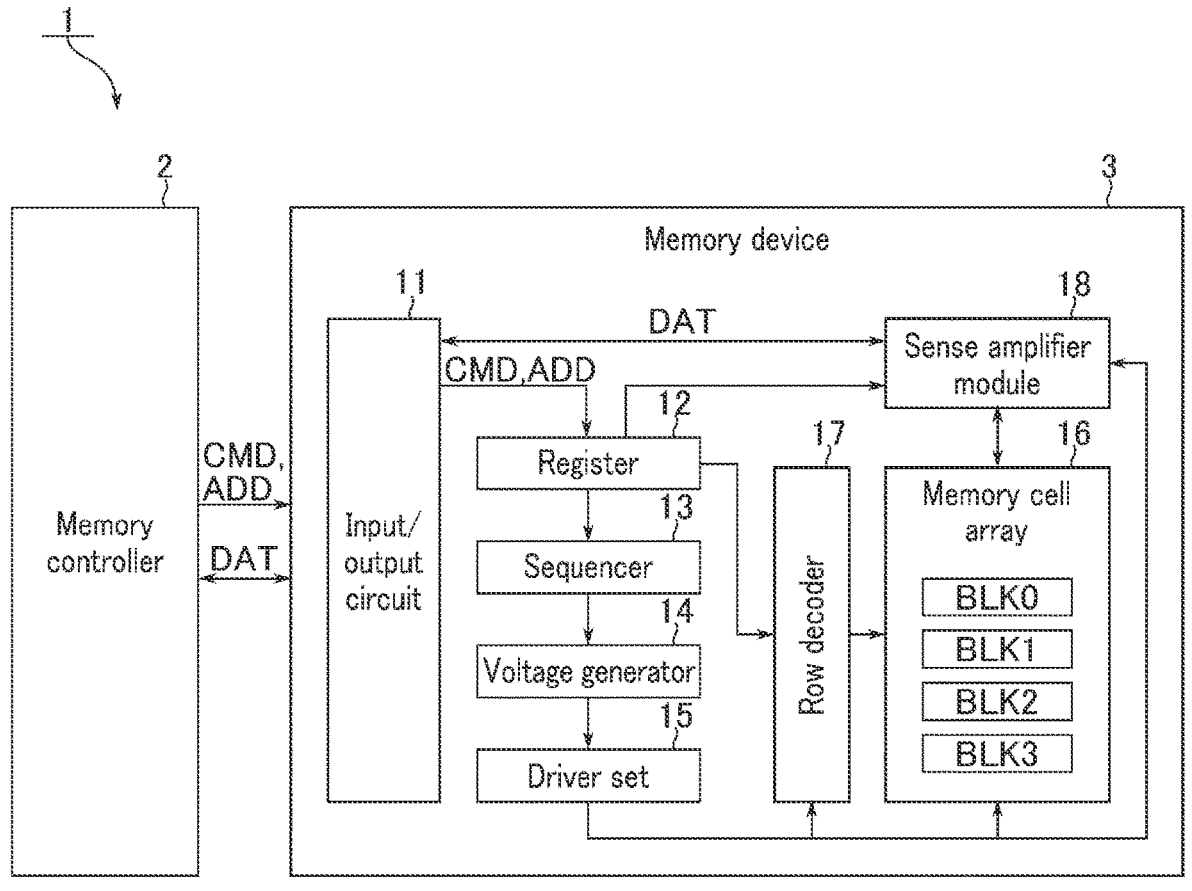
F I G. 1

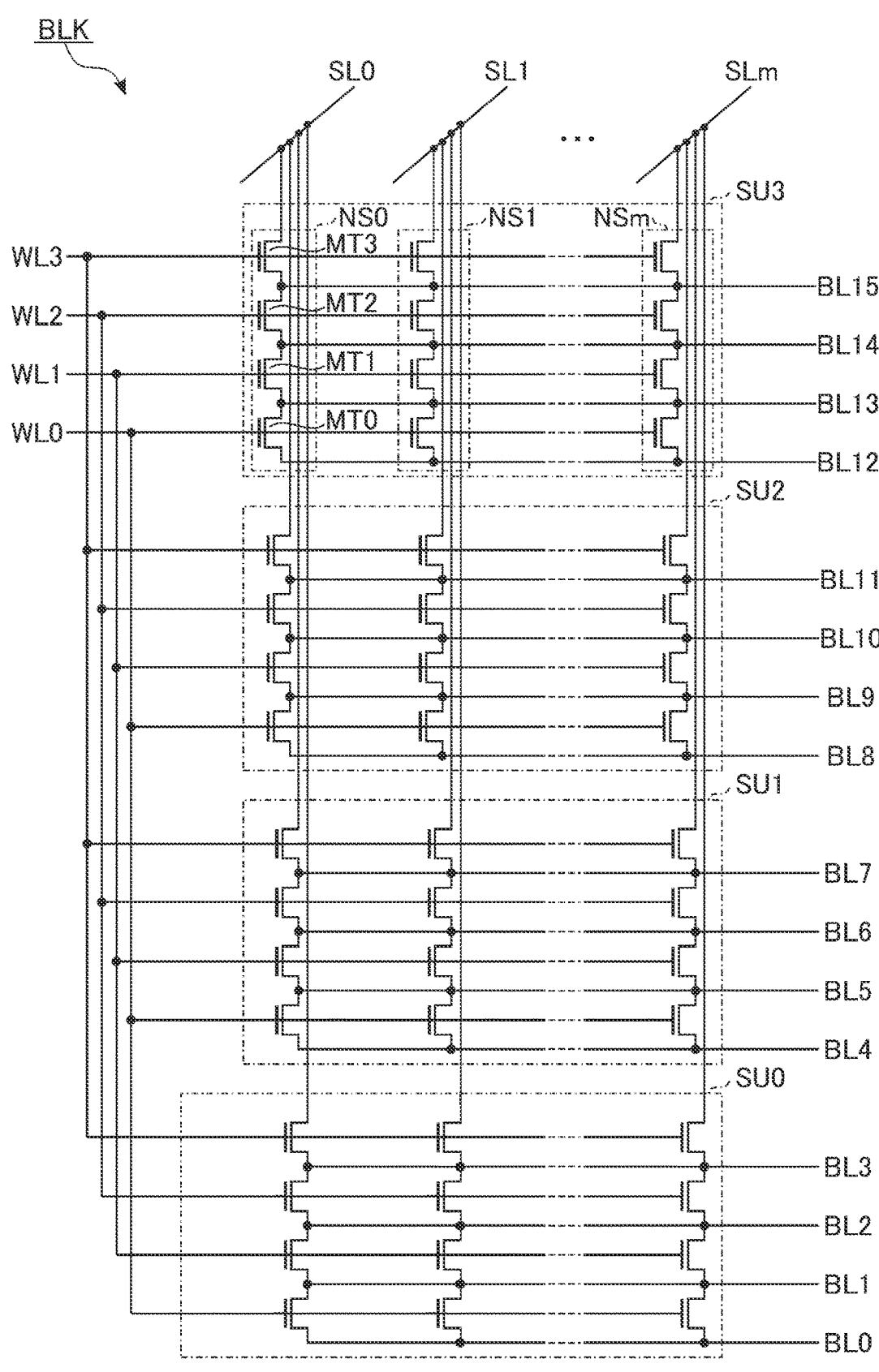
F I G. 2

MA
SL
SLTa
SP
CVa
SLTb
SLTb
SLTb
SLTa
V
V
SU0
SU1
SU2
SU3
BLK
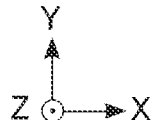
Y
Z ⊙ → X
F I G. 4

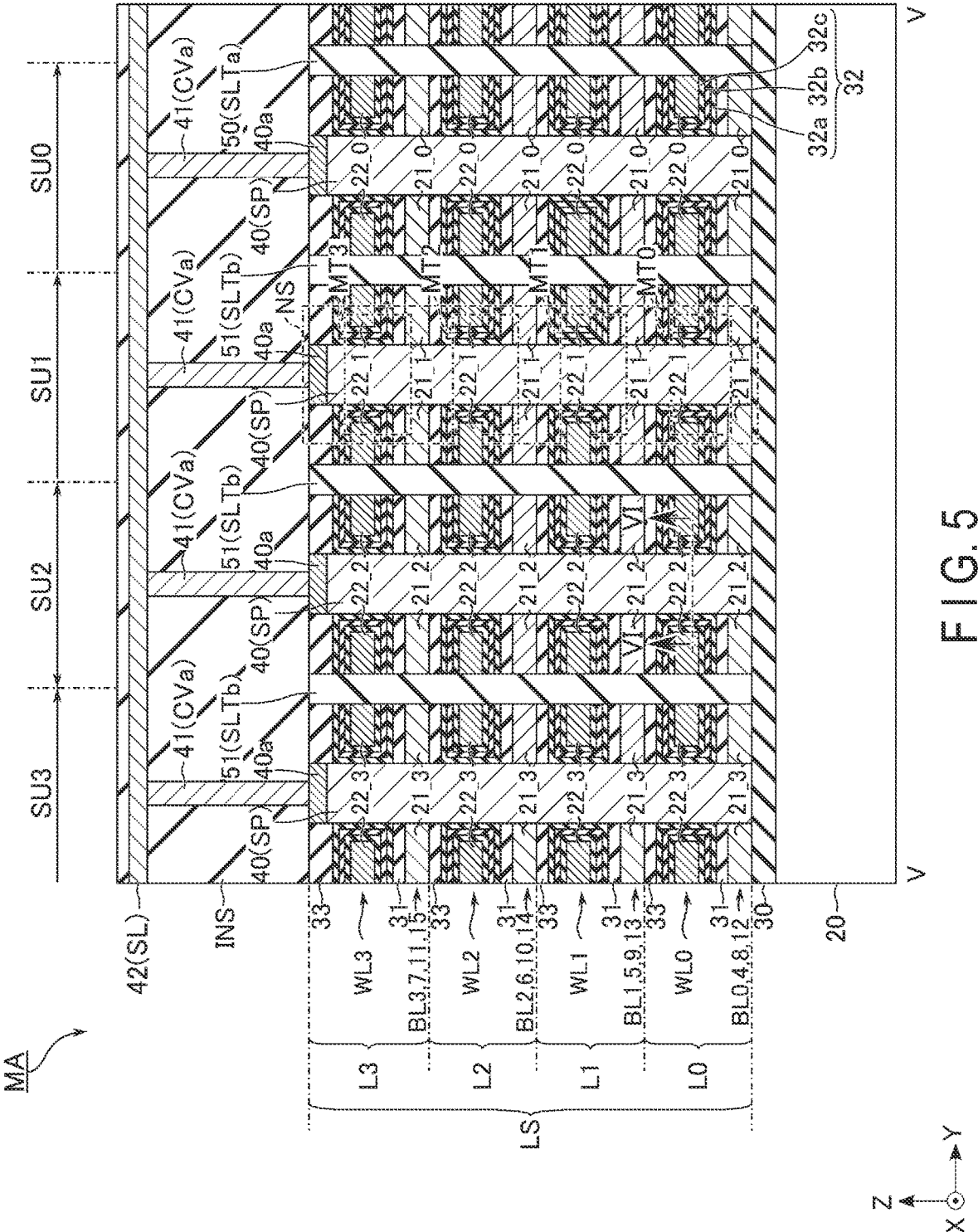
F I G. 5

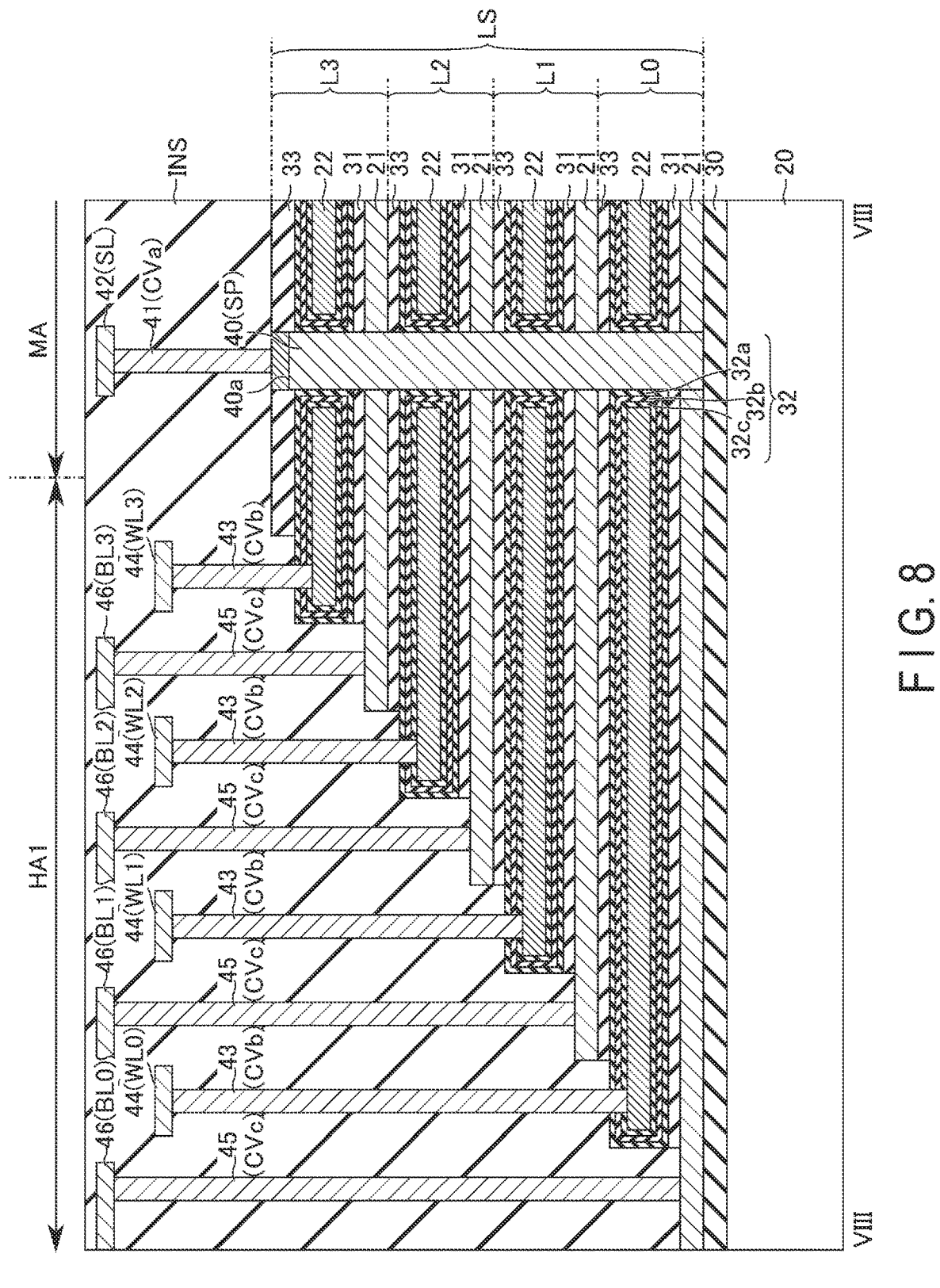
F I G. 8

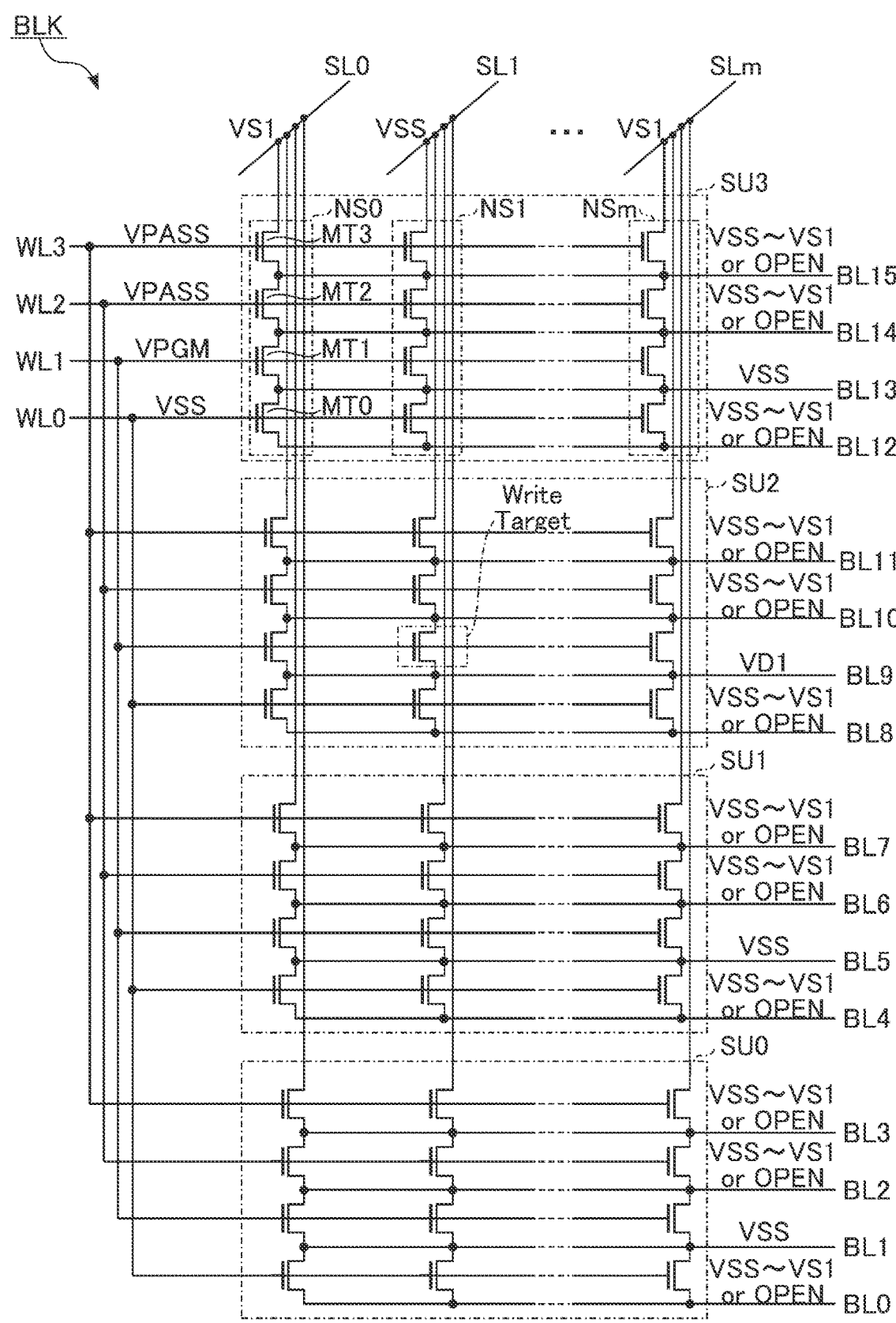
F I G . 9

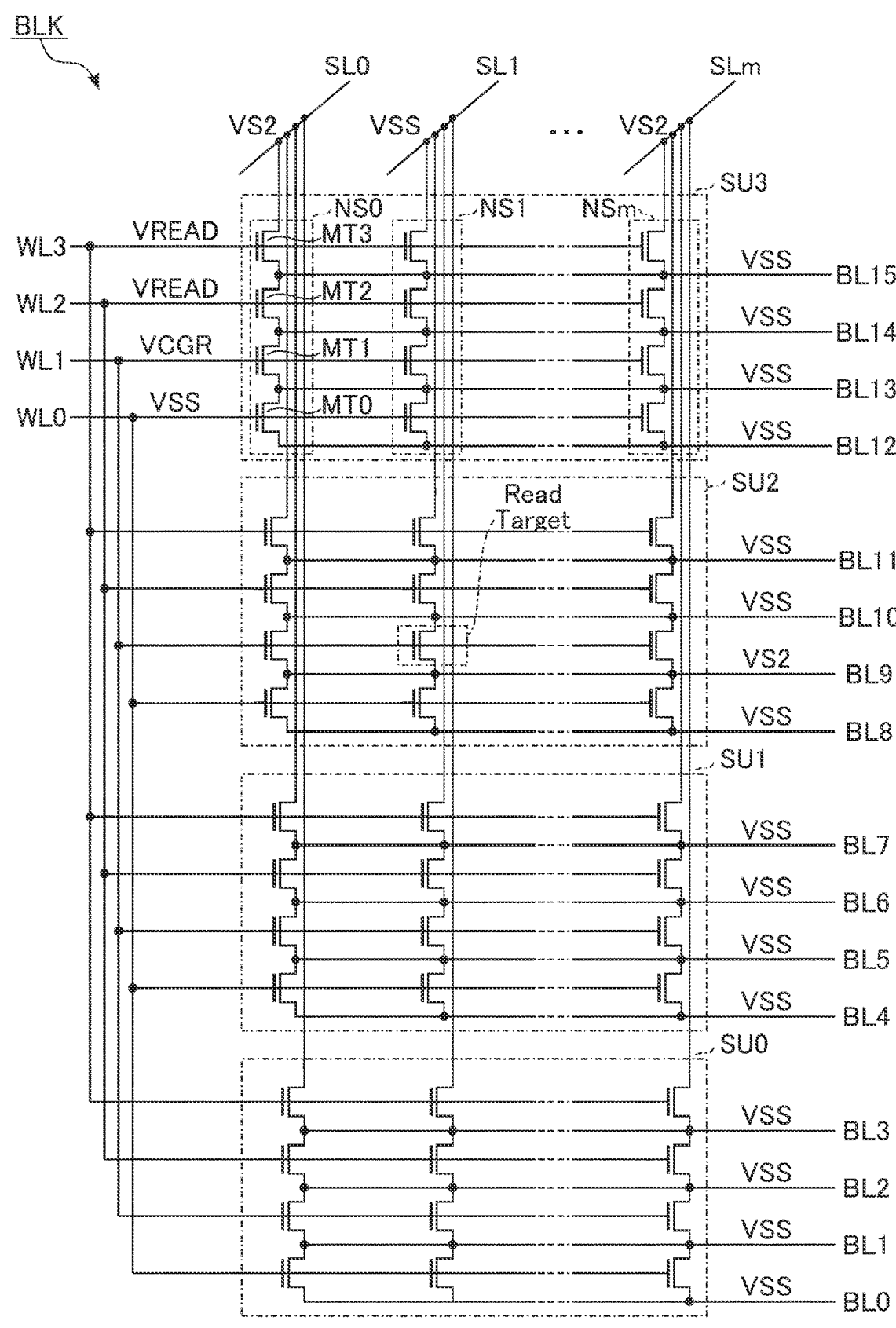
F I G. 10

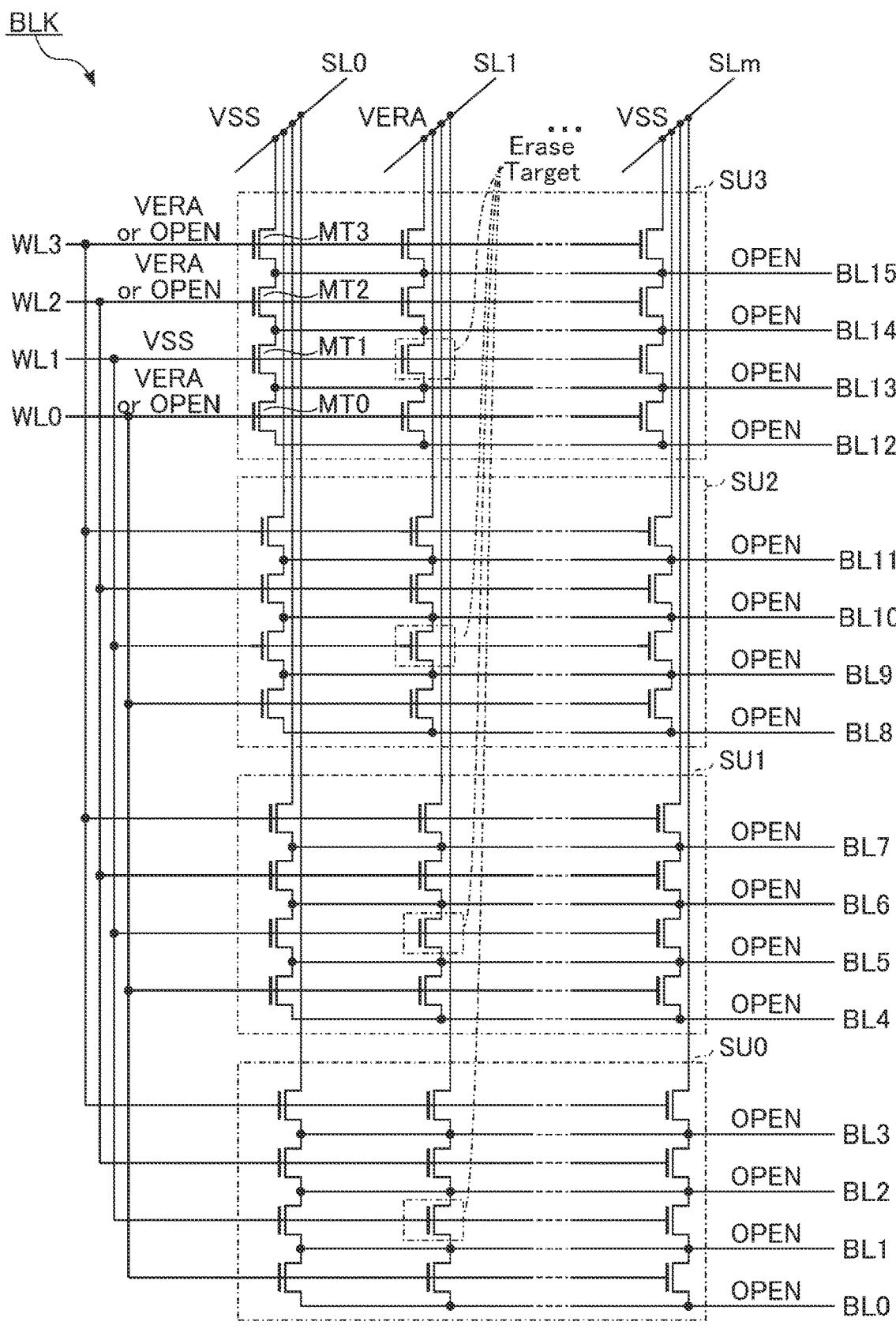
F I G. 11

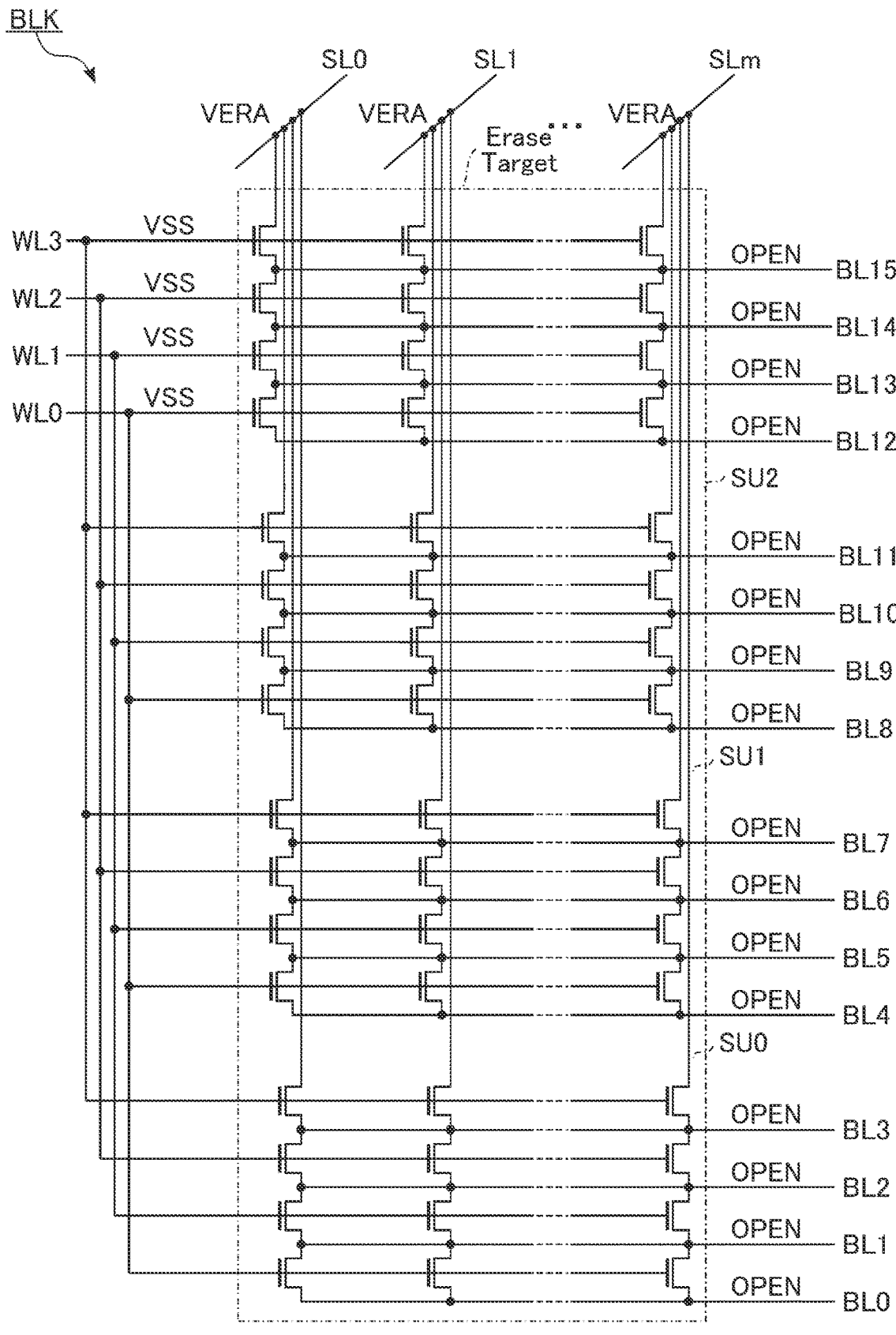
F I G. 12

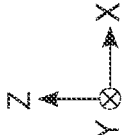
F I G. 13

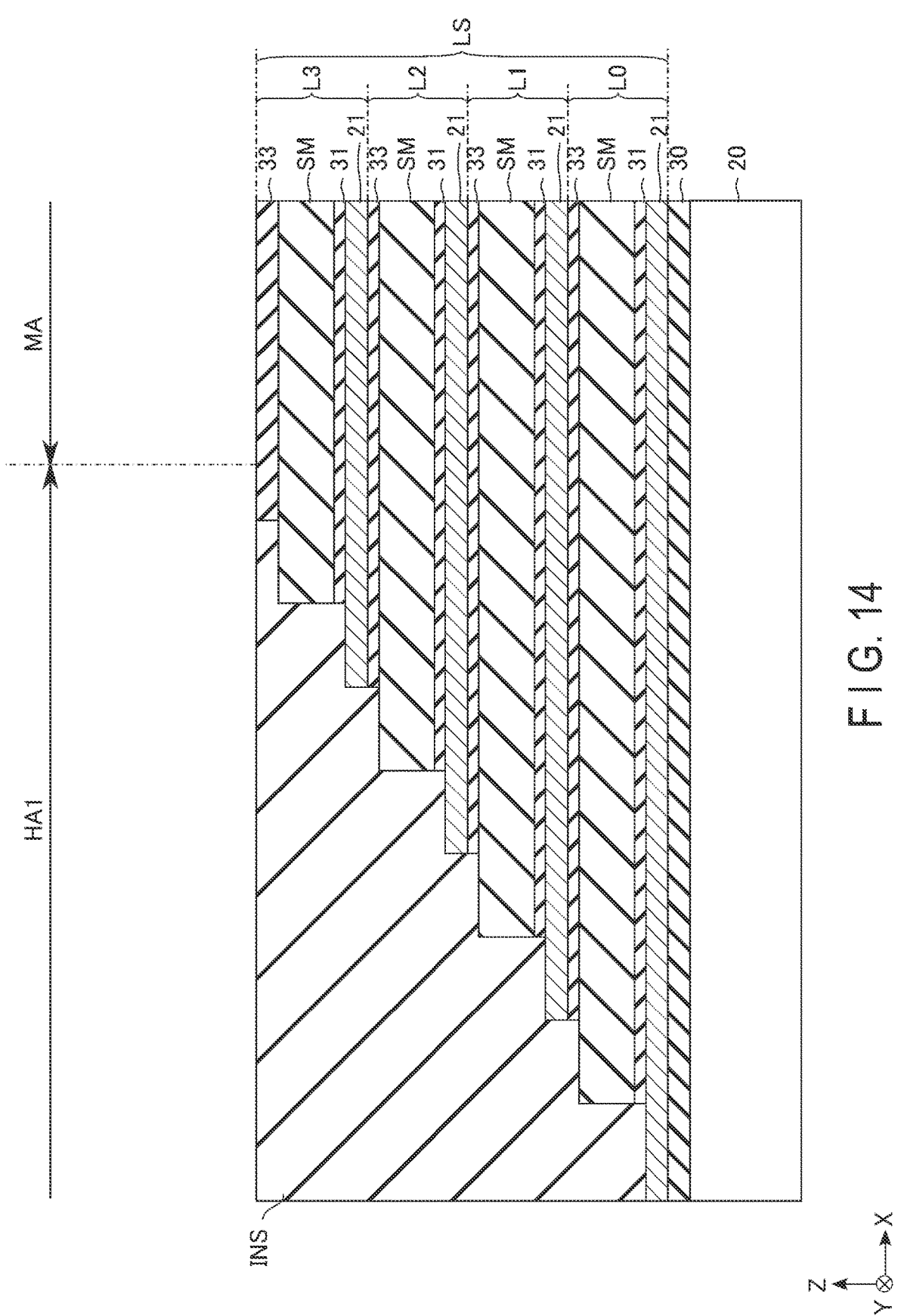
F I G. 14

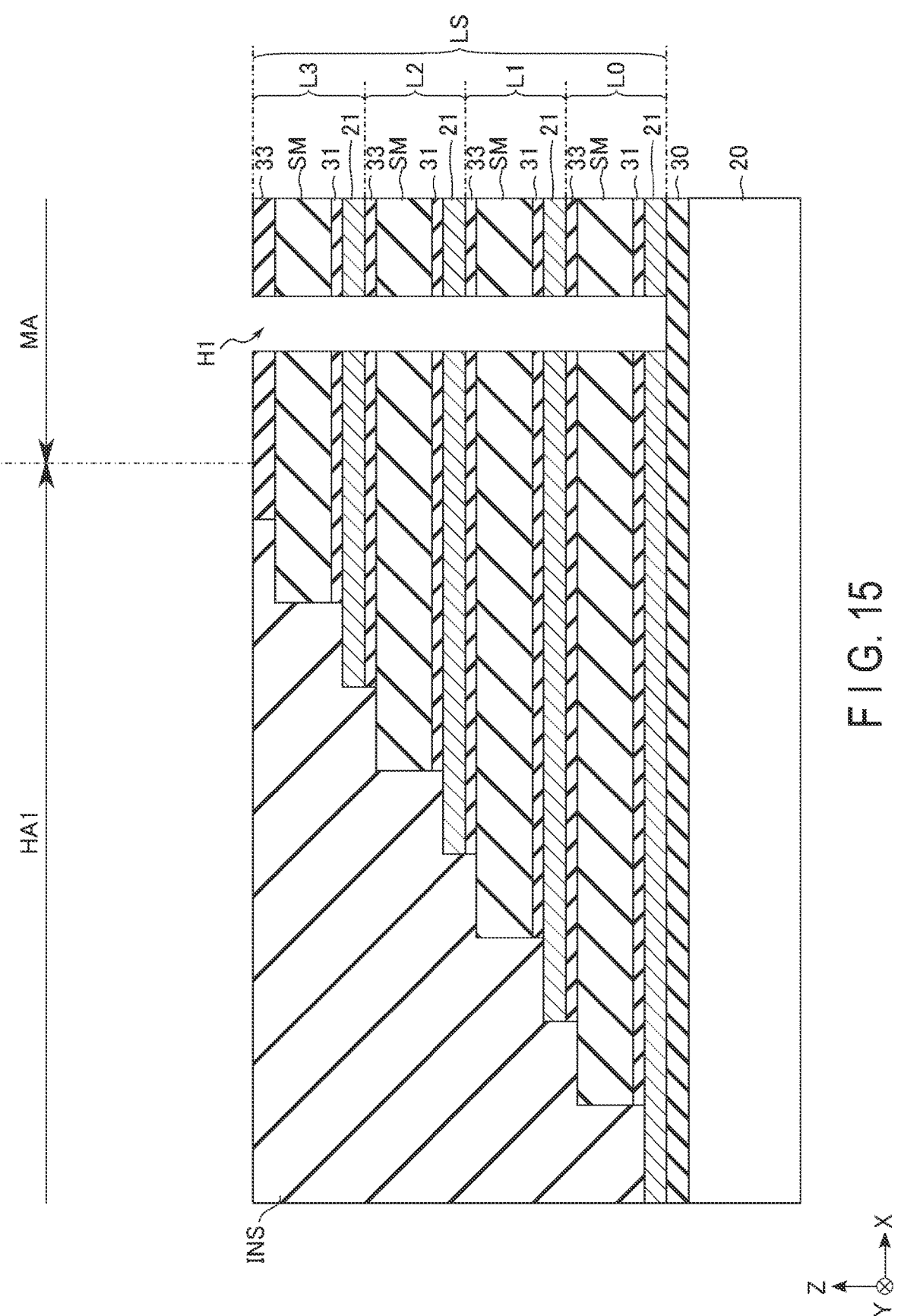
F I G. 15

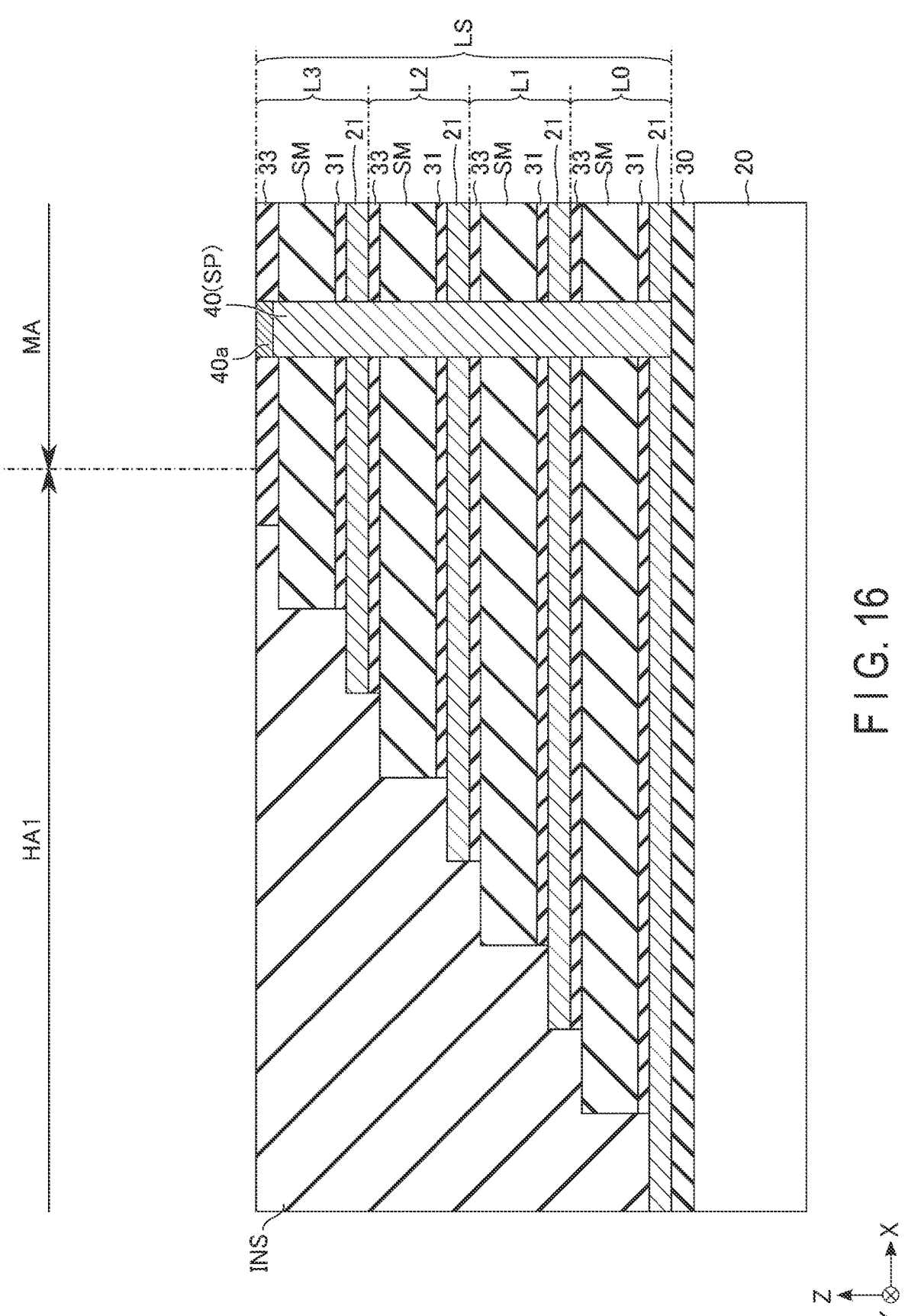
F I G. 16

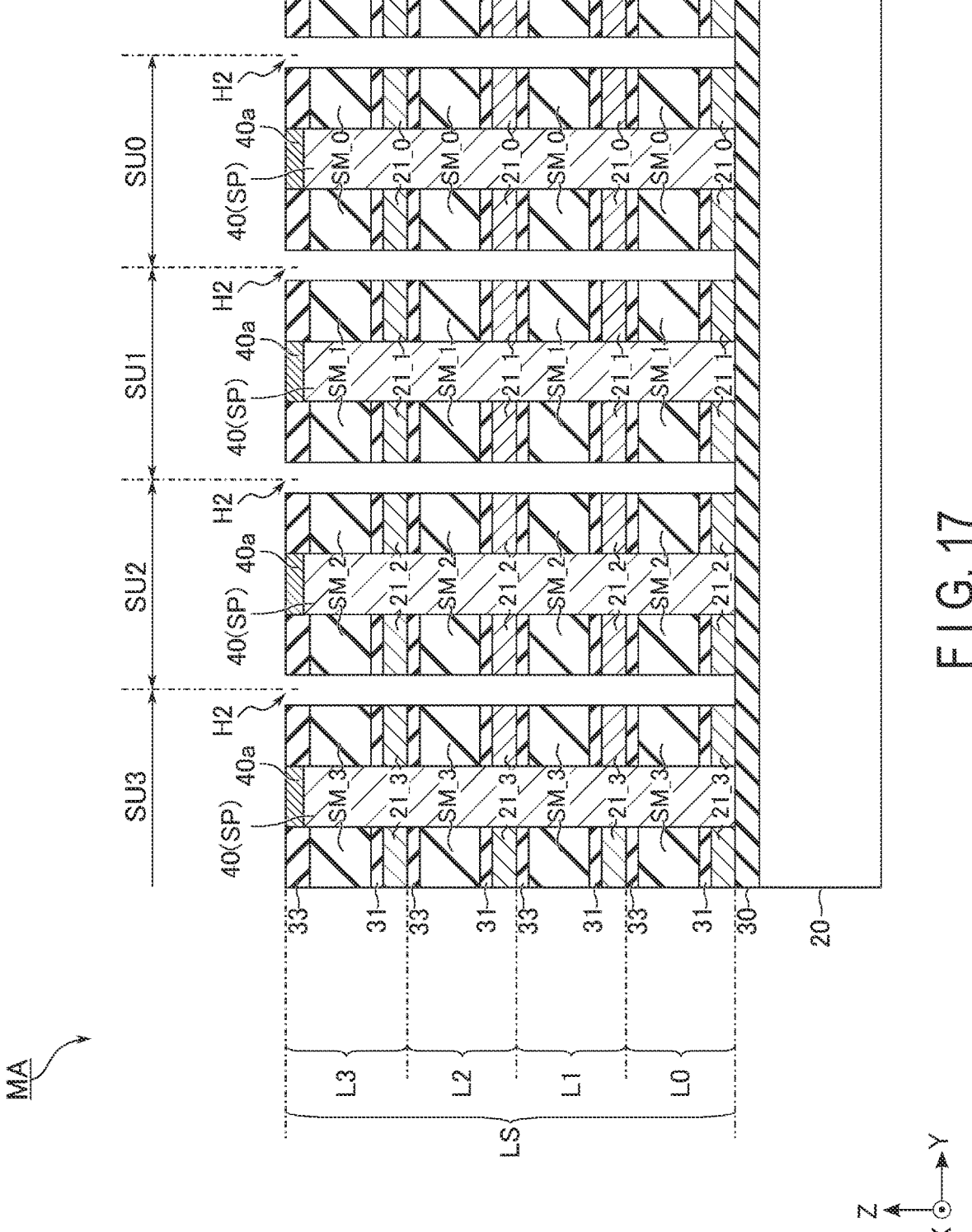
F I G. 17

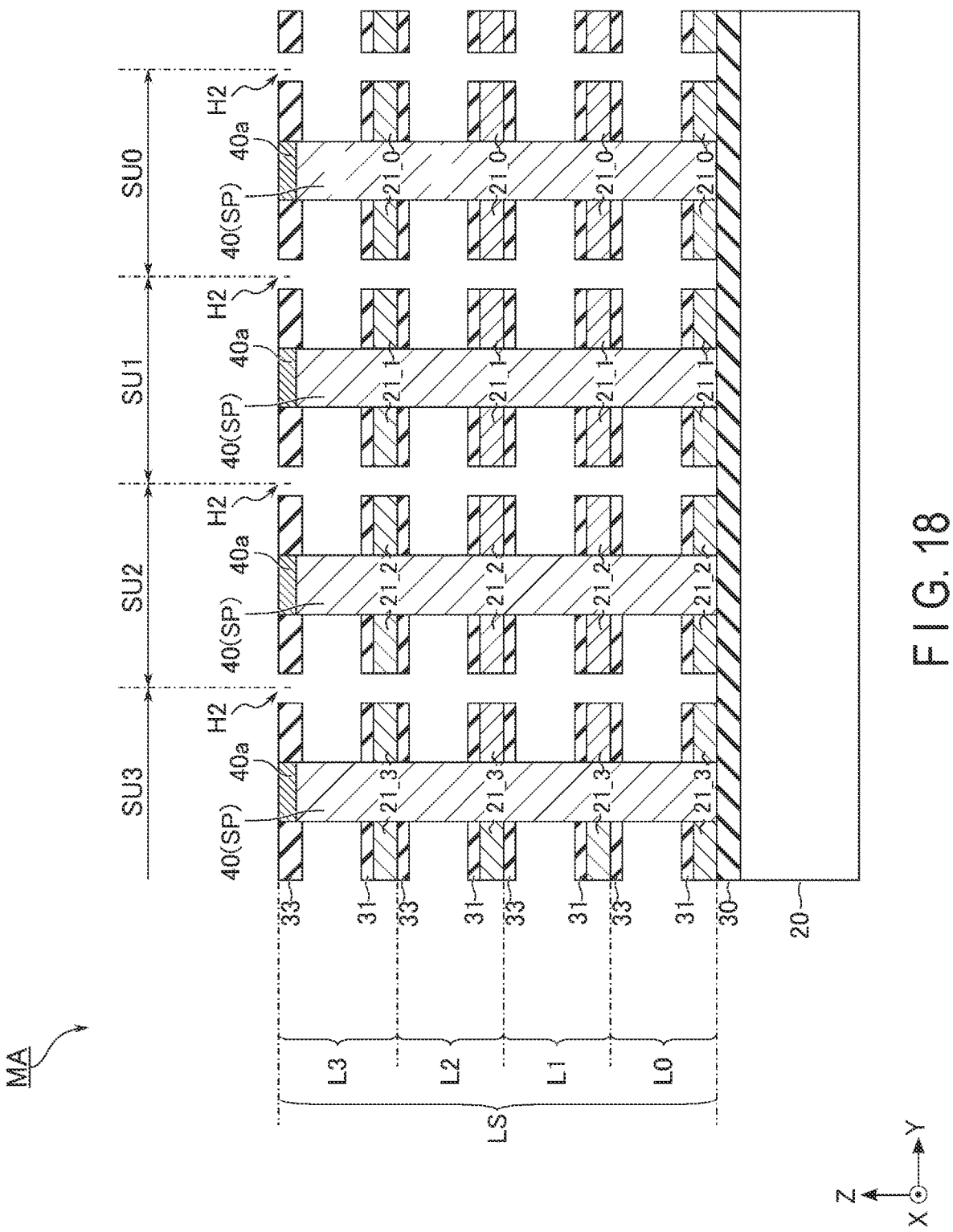
F I G. 18

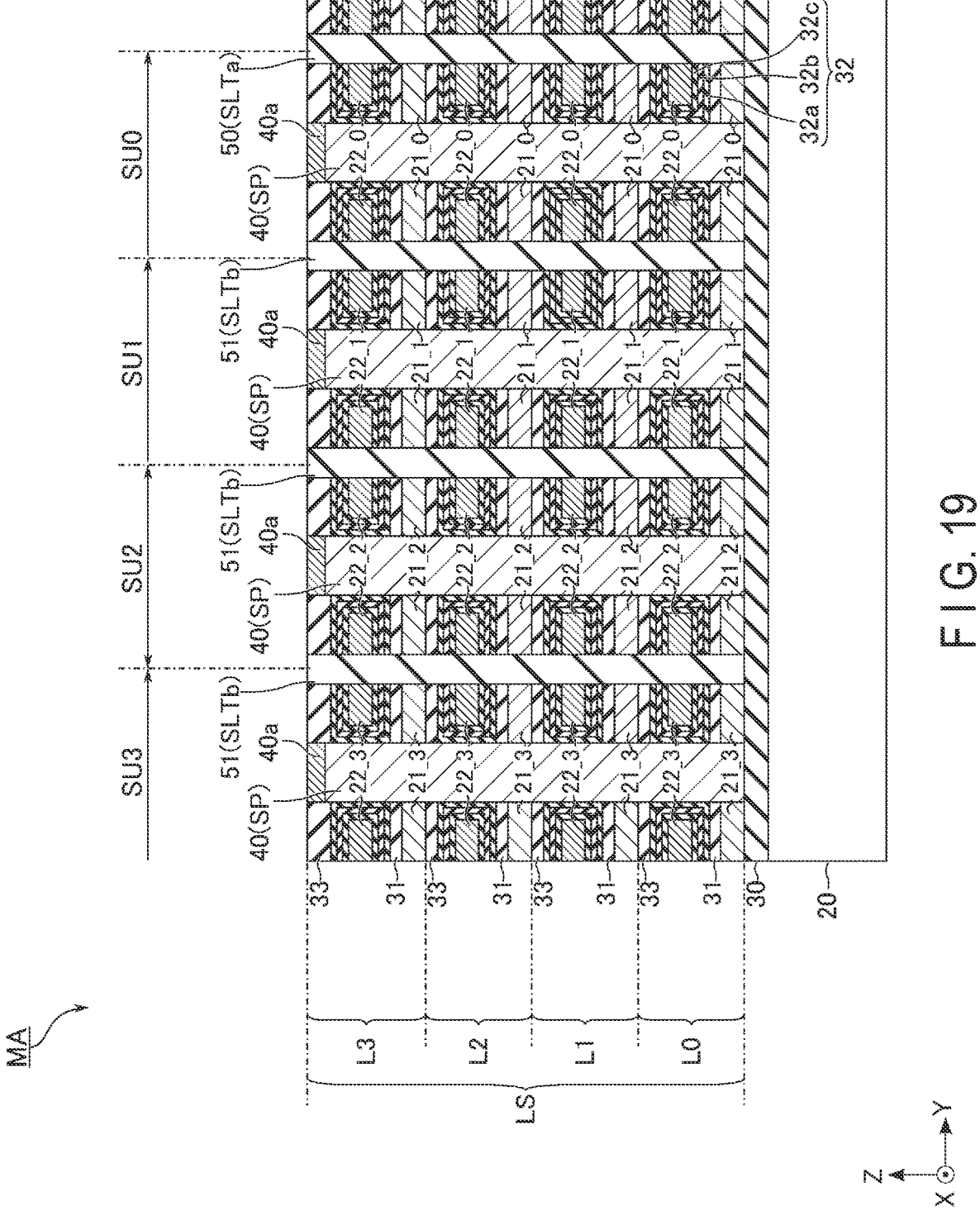
F I G. 19

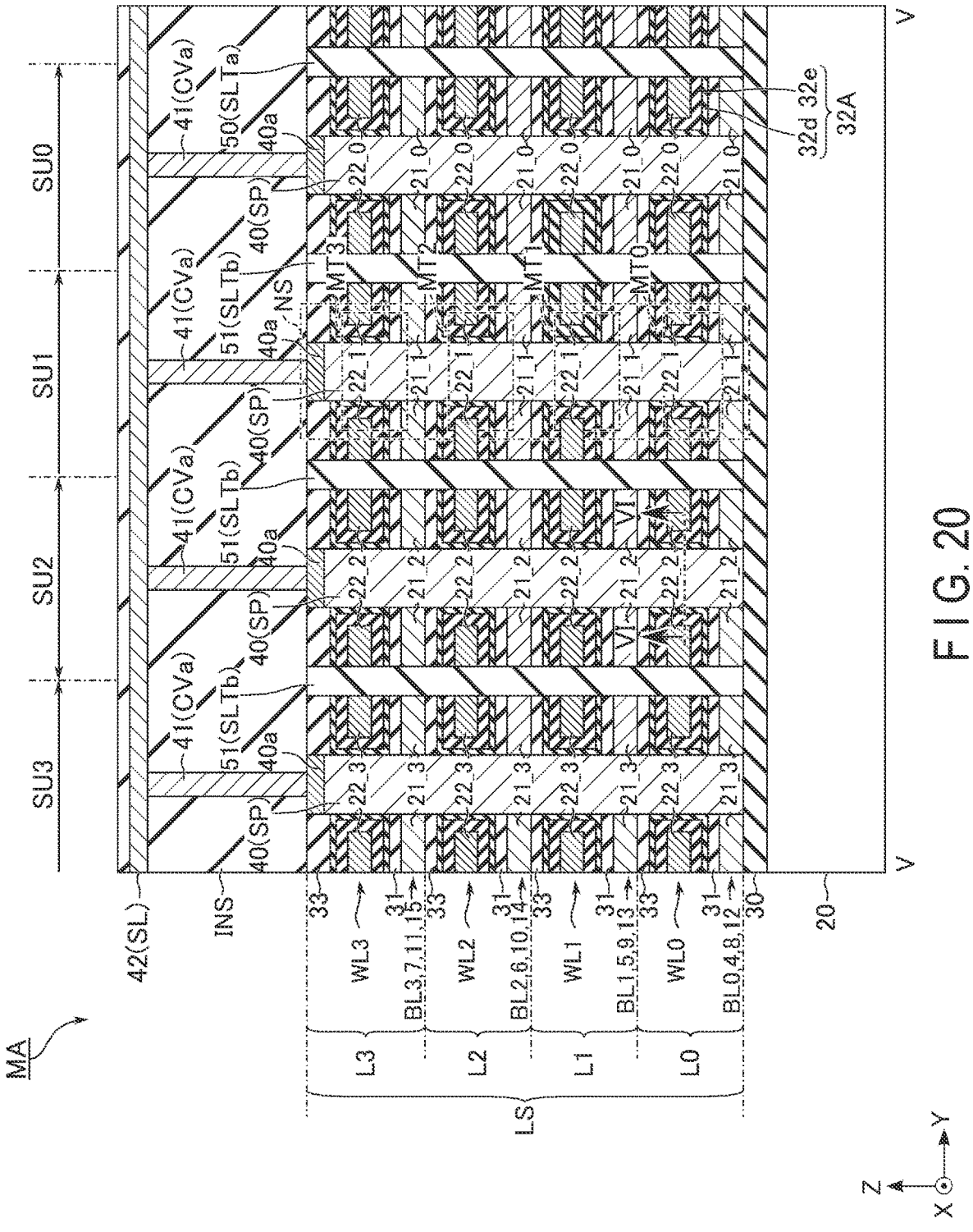
F I G. 20

MEMORY DEVICE

CROSS-REFERENCE TO RELATED APPLICATIONS

This application is a Continuation Application of PCT Application No. PCT/JP2021/045583, filed Dec. 10, 2021, the entire contents of which are incorporated herein by reference.

FIELD

Embodiments relate to a memory device.

BACKGROUND

A NOR flash memory is known as a memory device capable of storing data in a non-volatile manner. In a memory device such as a NOR flash memory, a three-dimensional memory structure has been studied for higher integration and larger capacity.

BRIEF DESCRIPTION OF THE DRAWINGS

FIG. 1 is a block diagram showing an example of a configuration of a memory system including a memory device according to an embodiment.

FIG. 2 is a circuit diagram showing an example of a circuit configuration of a memory cell array included in the memory device according to the embodiment.

FIG. 4 is a plan view showing an example of a planar layout in a memory region of the memory cell array according to the embodiment.

FIG. 5 is a cross-sectional view taken along line V-V of FIG. 4, showing an example of a cross-sectional structure of the memory cell array according to the embodiment.

FIG. 8 is a cross-sectional view taken along line VIII-VIII of FIG. 7, showing an example of a cross-sectional structure of the memory cell array according to the embodiment.

FIG. 9 is a circuit diagram showing an example of voltages applied to various interconnects in a write operation in the memory device according to the embodiment.

FIG. 10 is a circuit diagram showing an example of voltages applied to various interconnects in a read operation in the memory device according to the embodiment.

FIG. 11 is a circuit diagram showing a first example of voltages applied to various interconnects in an erase operation in the memory device according to the embodiment.

FIG. 12 is a circuit diagram showing a second example of voltages applied to various interconnects in an erase operation in the memory device according to the embodiment.

FIG. 13 is a cross-sectional view showing an example of a cross-sectional structure of the memory cell array according to the embodiment in the middle of manufacturing.

FIG. 14 is a cross-sectional view showing an example of a cross-sectional structure of the memory cell array according to the embodiment in the middle of manufacturing.

FIG. 15 is a cross-sectional view showing an example of a cross-sectional structure of the memory cell array according to the embodiment in the middle of manufacturing.

FIG. 16 is a cross-sectional view showing an example of a cross-sectional structure of the memory cell array according to the embodiment in the middle of manufacturing.

FIG. 17 is a cross-sectional view showing an example of a cross-sectional structure of the memory cell array according to the embodiment in the middle of manufacturing.

FIG. 18 is a cross-sectional view showing an example of a cross-sectional structure of the memory cell array according to the embodiment in the middle of manufacturing.

FIG. 19 is a cross-sectional view showing an example of a cross-sectional structure of the memory cell array according to the embodiment in the middle of manufacturing.

FIG. 20 is a cross-sectional view of an example of a cross-sectional structure of a memory cell array according to a modification.

DETAILED DESCRIPTION

Figure 3:
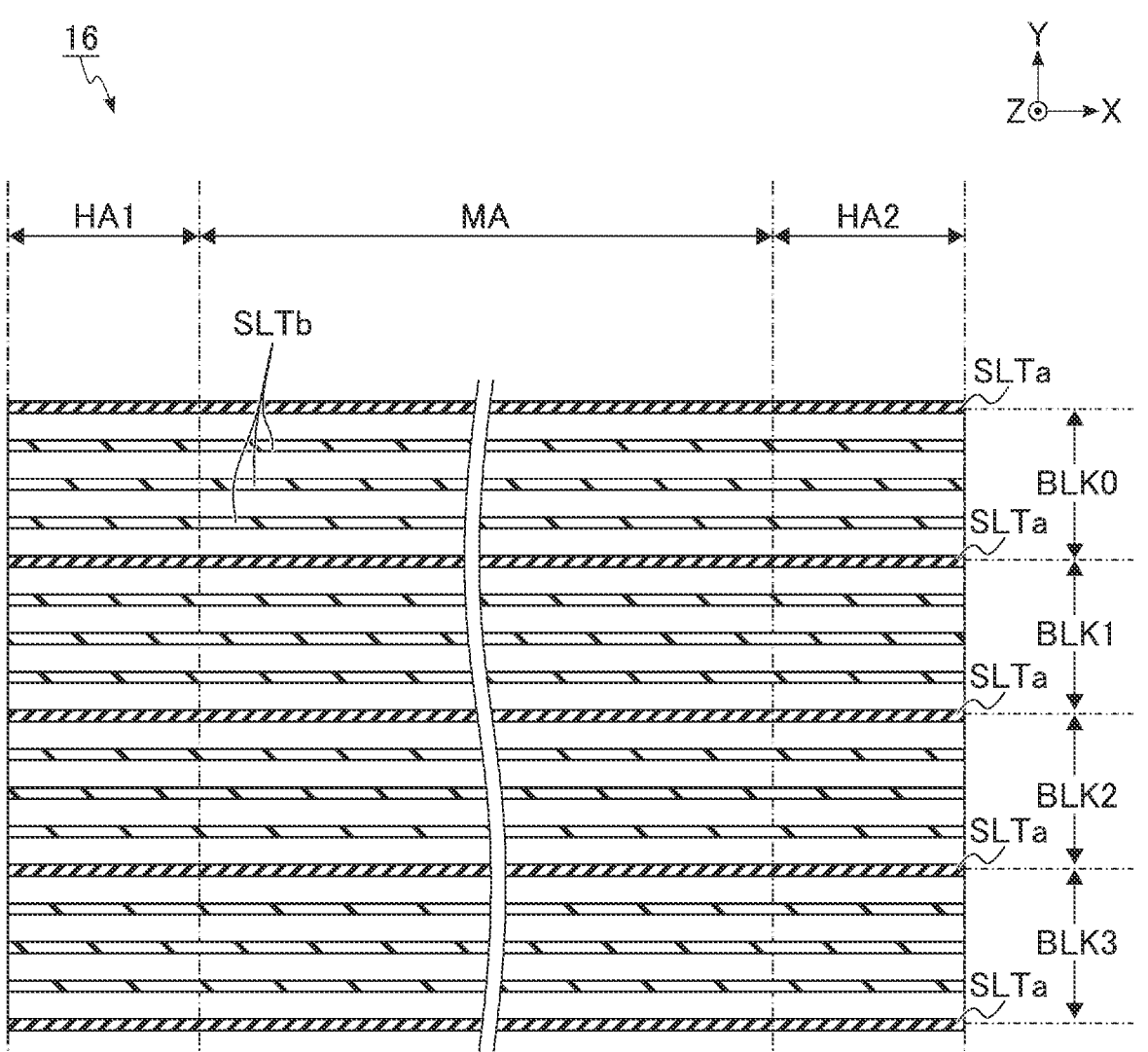
FIG. 3 is a plan view showing an example of a planar layout of the memory cell array according to the embodiment.

According to one embodiment, a memory device includes: a first semiconductor layer, a first conductive layer, a second semiconductor layer, and a second conductive layer that are arranged in this order in a first direction, spaced apart from each other; a first semiconductor film extending in the first direction, being in contact with the first semiconductor layer and the second semiconductor layer, and intersecting the first conductive layer and the second conductive layer; a first memory film provided between the first conductive layer and the first semiconductor film; and a second memory film provided between the second conductive layer and the first semiconductor film.

Hereinafter, an embodiment is described with reference to the drawings. The dimensions, scales, etc., used in the drawings are not binding on actual products.

Note that in the following description, the same reference numerals denote components having almost the same functions and configurations. For the purpose of distinguishing between elements having the same or substantially the same configurations, the description may add different characters or numerals after their respective reference signs.

Embodiment

1. Configuration 1.1 Memory System

A configuration of a memory system according to an embodiment is described.

FIG. 1 is a block diagram showing a configuration example of a memory system including a memory device according to the embodiment. A memory system 1 is a storage device. The memory system 1 performs a write operation and a read operation of data. The memory system 1 includes a memory controller 2 and a memory device 3.

The memory controller 2 is constituted by an integrated circuit such as a system-on-a-chip (SoC), for example. The memory controller 2 controls the memory device 3 based on a request from an external host device (not shown). Specifically, for example, in a write operation, the memory controller 2 transmits data to be written to the memory device 3. In a read operation, the memory controller 2 receives data that is read from the memory device 3. The memory controller 2 controls the memory device 3. Specifically, for example, the memory controller 2 rewrites data written in a certain storage area in the memory device 3 to another storage area, and then erases the data written in the certain storage area.

The memory device 3 is a non-volatile memory. The memory device 3 is, for example, a NOR flash memory. The memory device 3 stores data in a non-volatile manner.

1.2 Memory Device

An internal configuration of the memory device according to the embodiment will continuously be described with reference to the block diagram shown in FIG. 1. The memory device 3 includes an input/output circuit 11, a register 12, a sequencer 13, a voltage generator 14, a driver set 15, a memory cell array 16, a row decoder 17, and a sense amplifier module 18.

The input/output circuit 11 transmits and receives various signals to and from the memory controller 2. The signals transmitted and received by the input/output circuit 11 include, for example, a command CMD, an address ADD, and data DAT. The command CMD specifies an operation that the memory controller 2 instructs the memory device 3 to perform. The address ADD specifies a storage area in the memory device 3. The data DAT includes data (write data) to be written to the memory device 3 or data (read data) that is read from the memory device 3.

The input/output circuit 11 transmits the address ADD and command CMD and the write data DAT to the register 12 and the sense amplifier module 18, respectively. The input/output circuit 11 receives the read data DAT from the sense amplifier module 18.

The register 12 stores the address ADD and the command CMD.

The sequencer 13 controls the entire operation of the memory device 3 based on the command CMD stored in the register 12.

The voltage generator 14 generates voltages used in a write operation, a read operation, an erase operation, etc.

The driver set 15 supplies the voltages generated by voltage generator 14 to the memory cell array 16, the row decoder 17, and the sense amplifier module 18.

The memory cell array 16 includes a plurality of blocks BLK, a plurality of bit lines, a plurality of source lines, and a plurality of word lines. In the example of FIG. 1, a case is shown where the memory cell array 16 includes four blocks BLK0, BLK1, BLK2, and BLK3. The block BLK is, for example, a storage area corresponding to a predetermined data capacity in the memory cell array 16. Each block BLK includes a plurality of memory cell transistors. Each memory cell transistor is specified by selecting a bit line, a source line, and a word line. The detailed configuration of the memory cell array 16 will be described later.

The row decoder 17 selects one of the blocks BLK0 to BLK3 based on the address ADD in the register 12. The row decoder 17 further selects a word line in the selected block BLK based on the address ADD in the register 12.

The sense amplifier module 18 selects a set of a bit line and a source line based on the address ADD in the register 12. In a write operation, the sense amplifier module 18 transfers write data DAT to the memory cell array 16 via the selected bit line. In a read operation, the sense amplifier module 18 senses a threshold voltage of a memory cell transistor via the selected bit line. The sense amplifier module 18 generates read data DAT based on a result of the sensing.

1.3 Circuit Configuration of Memory Cell Array

FIG. 2 is a circuit diagram showing an example of a circuit configuration of the memory cell array included in the memory device according to the embodiment. FIG. 2 shows one block BLK of the plurality of blocks BLK included in the memory cell array 16. As shown in FIG. 2, the memory cell array 16 is coupled to, for example, four word lines WL0 to WL3, (m+1) source lines SL0 to SLm, and 16 bit lines BL0 to BL15 (m is an integer of 2 or greater). FIG. 2 shows a case where m is 2 or greater; however, the embodiment is not limited to this example and m may be 0 or 1.

The block BLK includes a plurality of string units SU. Each string unit SU includes a plurality of NOR strings NS. Each NOR string NS includes a plurality of memory cell transistors MT. Each memory cell transistor MT includes a control gate and a charge storage layer. Each memory cell transistor MT stores data in a non-volatile manner. FIG. 2 illustrates a case where each block BLK includes four string units SU0 to SU3, each string unit SU includes (m+1) NOR strings NS0 to NSm, and each NOR string NS includes four memory cell transistors MT0 to MT3.

In each NOR string NS, the memory cell transistors MT0 to MT3 are coupled in series. A first end of each memory cell transistor MT is coupled to a corresponding bit line BL.

Specifically, in the string unit SU0, the first ends of the memory cell transistors MT0 are commonly coupled to the bit line BL0. In the string unit SU0, the first ends of the memory cell transistors MT1 and the second ends of the memory cell transistors MT0 are commonly coupled to the bit line BL1. In the string unit SU0, the first ends of the memory cell transistors MT2 and the second ends of the memory cell transistors MT1 are commonly coupled to the bit line BL2. In the string unit SU0, the first ends of the memory cell transistors MT3 and the second ends of the memory cell transistors MT2 are commonly coupled to the bit line BL3.

In the string unit SU1, the first ends of the memory cell transistors MT0 are commonly coupled to the bit line BL4. In the string unit SU1, the first ends of the memory cell transistors MT1 and the second ends of the memory cell transistors MT0 are commonly coupled to the bit line BL5. In the string unit SU1, the first ends of the memory cell transistors MT2 and the second ends of the memory cell transistors MT1 are commonly coupled to the bit line BL6. In the string unit SU1, the first ends of the memory cell transistors MT3 and the second ends of the memory cell transistors MT2 are commonly coupled to the bit line BL7.

In the string unit SU2, the first ends of the memory cell transistors MT0 are commonly coupled to the bit line BL8. In the string unit SU2, the first ends of the memory cell transistors MT1 and the second ends of the memory cell transistors MT0 are commonly coupled to the bit line BL9. In the string unit SU2, the first ends of the memory cell transistors MT2 and the second ends of the memory cell transistors MT1 are commonly coupled to the bit line BL10. In the string unit SU2, the first ends of the memory cell transistors MT3 and the second ends of the memory cell transistors MT2 are commonly coupled to the bit line BL11.

In the string unit SU3, the first ends of the memory cell transistors MT0 are commonly coupled to the bit line BL12. In the string unit SU3, the first ends of the memory cell transistors MT1 and the second ends of the memory cell transistors MT0 are commonly coupled to the bit line BL13. In the string unit SU3, the first ends of the memory cell transistors MT2 and the second ends of the memory cell transistors MT1 are commonly coupled to the bit line BL14. In the string unit SU3, the first ends of the memory cell transistors MT3 and the second ends of the memory cell transistors MT2 are commonly coupled to the bit line BL15.

Each NOR string NS is coupled to a corresponding source line SL.

Specifically, the second ends of the memory cell transistors MT3 of each NOR string NS0 of respective string units SU are commonly coupled to the source line SL0. The second ends of the memory cell transistors MT3 of each NOR string NS1 of respective string units SU are commonly coupled to the source line SL1. The second ends of the memory cell transistors MT3 of each NOR string NSm of respective string units SU are commonly coupled to the source line SLm.

In each NOR string NS, each memory cell transistor MT is coupled to a corresponding word line WL.

Specifically, the gates of the memory cell transistors MT0 of each NOR string NS0 of respective string units SU are commonly coupled to the word line WL0. The gates of the memory cell transistors MT1 of each NOR string NS1 of respective string units SU are commonly coupled to the word line WL1. The gates of the memory cell transistors MT2 of each NOR string NS1 of respective string units SU are commonly coupled to the word line WL2. The gates of memory cell transistors MT3 of each NOR string NS1 of respective string units SU are commonly coupled to the word line WL3.

The above configuration is repeated for each block BLK. The word lines WL0 to WL3 and the bit lines BL0 to BL15 are provided independently for each block BLK, for example. The source lines SL0 to SLm are shared between the blocks BLK, for example.

The circuit configuration of the memory cell array 16 included in the memory device 3 according to the embodiment is not limited to the configuration described above. For example, the number of string units SU included in each block BLK may be designed to be any number. The number of NOR strings NS included in each string unit SU may be designed to be any number. The number of memory cell transistors MT included in each NOR string NS may be designed to be any number.

1.4 Structure of Memory Cell Array

Next, a structure of the memory cell array included in the memory device according to the embodiment is described. Note that in the drawings to be referred to hereinafter, an X direction corresponds to the extending direction of the word lines WL and the bit lines BL. A Y direction corresponds to the extending direction of the source lines SL. A Z direction corresponds to a direction perpendicular to the surface of the semiconductor substrate used for forming the memory device 3. The plan views use hatching as appropriate to achieve better viewability. Such hatching is not necessarily related to materials or properties of the hatched objects or components. The sectional views may also omit components as appropriate to achieve better viewability.

1.4.1 Outline of Planar Layout

FIG. 3 is a plan view showing an example of a planar layout of the memory cell array according to the embodiment. What is shown in FIG. 3 covers a structural part corresponding to four blocks BLK0 to BLK3. As shown in FIG. 3, the memory cell array 16 includes a stacked interconnect structure and a plurality of members SLTa and SLTb.

The stacked interconnect structure is a structure in which a plurality of interconnects including the word lines WL and the bit lines BL are stacked. The planar layout of the stacked interconnect structure is divided into, for example, a memory region MA and hookup areas HA1 and HA2 in the X direction. The memory area MA is an area in which a plurality of NOR strings NS are formed in the stacked interconnect structure. The hookup areas HA1 and HA2 are areas used for connection between the plurality of word lines WL and the row decoder 17 and coupling between the plurality of bit lines BL and the sense amplifier module 18. The memory area MA is interposed between the hookup areas HA1 and HA2.

Each of the plurality of members SLTa is a plate-shaped insulator extending along the X direction. The plurality of members STLa are arranged in the Y direction. Each member SLTa divides the stacked interconnect structure so as to cross the memory region MA and the hookup areas HA1 and HA2. The stacked interconnect structure divided by two members SLTa corresponds to one block BLK.

Each of the plurality of members SLTb is a plate-shaped insulator extending along the X direction. Three members SLTb are arranged in the Y direction between two adjacent members SLTa. Each member SLTb divides the stacked interconnect structure so as to cross the memory region MA and the hookup areas HA1 and HA2. The stacked interconnect structure divided by two members SLTb or one member SLTa and one member SLTb corresponds to one string unit SU.

The planar layout of the memory cell array 16 described above is repeatedly arranged in the Y direction. The planar layout of the memory cell array 16 is not limited to the above-described planar layout. For example, the number of members SLTb disposed between two members SLTa is changed according to the number of string units SU included in one block BLK.

1.4.2 Memory Area

Next, a configuration of the memory area of the memory cell array according to the embodiment is described.

1.4.2.1 Planar Layout

FIG. 4 is a plan view showing an example of a detailed planar layout in a memory area of the memory cell array according to the embodiment. FIG. 4 illustrates a part of the memory area MA including one block BLK (that is, string units SU0 to SU3) and two members SLTa interposing the block BLK. As shown in FIG. 4, the memory cell array 16 in its memory area MA includes a plurality of source pillars SP, a plurality of contacts CVa, and a plurality of source lines SL.

The source pillar SP is, for example, a columnar structure provided in the stacked interconnect structure. Each source pillar SP functions as one NOR string NS. The plurality of source pillars SP are arranged in a matrix in an area between two adjacent members SLTa, for example. Specifically, in one block BLK, the plurality of source pillars SP arranged in the X direction are arranged in four columns in the Y direction. A member SLTb is arranged between the source pillars SP in two adjacent columns.

The plurality of source lines SL are arranged in the X direction. Each source line SL extends in the Y direction. Each source line SL is arranged to overlap at least one source pillar SP in each string unit SU in a plan view. In the example of FIG. 4, a case is shown where one source line SL is arranged so as to overlap one source pillar SP for each string unit SU in a plan view. The source pillars SP and the source line SL arranged so as to overlap the source pillars SP in a plan view are coupled via the contacts CVa.

1.4.2.2 Cross-Sectional Structure

FIG. 5 is a cross-sectional view, taken along line V-V in FIG. 4, showing an example of a cross-sectional structure in the memory area of the memory cell array according to the embodiment. FIG. 5 illustrates a cross-sectional structure of the string units SU0 to SU2 along the YZ plane. As shown in FIG. 5, in the memory area MA, the memory cell array 16 further includes a semiconductor substrate 20, insulating layers 30 and INS, a stacked interconnect structure LS, a plurality of semiconductor films 40, a plurality of conductive layers 41 and 42, and a plurality of insulating films 50 and 51.

The semiconductor substrate 20 is, for example, a silicon substrate. An insulating layer 30 is provided on the upper surface of the semiconductor substrate 20. The insulating layer 30 includes, for example, silicon oxide. For example, circuits used for the row decoder 17, the sense amplifier module 18, and the like are formed in the semiconductor substrate 20 and the insulating layer 30.

The stacked interconnect structure LS is provided on the upper surface of the insulating layer 30. Each layer constituting the stacked interconnect structure LS has a plate-shaped structure extending along the XY plane. The stacked interconnect structure LS is divided by each of the plurality of insulating films 50 and 51.

Each of the plurality of insulating films 50 and 51 is a plate-shaped insulator extending along the XZ plane. Each of the plurality of insulating films 50 and 51 includes, for example, silicon oxide. The insulating films 50 and 51 are used as members SLTa and SLTb, respectively.

Each of the plurality of semiconductor films 40 is a columnar semiconductor extending in the Z-direction. Each of the plurality of semiconductor films 40 includes, for example, polysilicon including an N-type impurity such as phosphorus (P) or arsenic (As). Each of the plurality of semiconductor films 40 penetrates the stacked interconnect structure LS. The lower end of each of the plurality of semiconductor films 40 reaches the insulating layer 30. The semiconductor film 40 is used as the source pillar SP.

The semiconductor portion 40a is formed on the upper portion of each of the semiconductor films 40. The semiconductor portion 40a includes polysilicon containing an N-type impurity. The concentration of the N-type impurity in the semiconductor portion 40a is higher than the concentration of the N-type impurity in the semiconductor film 40.

A conductive layer 41 is provided on the upper surface of each of the plurality of semiconductor films 40. The conductive layer 41 extends in the Z direction. The conductive layer 41 is used as the contact CVa. The ohmic junction reduces the electrical resistance between the conductive layer 41 and the semiconductor portion 40a.

A corresponding one of the conductive layers 42 is in contact with the upper surface of each of the conductive layers 41. The conductive layer 42 extends in the Y direction. The conductive layer 42 is used as the source line SL. One conductive layer 42 is in contact with one contact CVa in each of the spaces partitioned by the members SLTa and SLTb. The conductive layers 41 and 42 are covered with the insulating layer INS.

Next, the stacked interconnect structure LS is described in detail.

The stacked interconnect structure LS includes four layers L0, L1, L2, and L3. The four layers L0 to L3 are stacked in this order. The four layers L0 to L3 have structures equivalent to each other. Each of the four layers L0 to L3 includes a semiconductor layer 21, a conductive layer 22, insulating layers 31 and 33, and a stacked film 32. The stacked film 32 includes a tunnel insulating film 32a, a charge storage film 32b, and a block insulating film 32c.

The semiconductor layer 21 includes, for example, polysilicon containing an N-type impurity such as phosphorus or arsenic. The concentration of the N-type impurity contained in the semiconductor layer 21 is equal to or higher than the concentration of the N-type impurity contained in the semiconductor film 40. As described above, the semiconductor layer 21 is divided for each string unit SU by the insulating films 50 and 51. Therefore, the semiconductor layer 21 of each layer L is divided into semiconductor layers 21_0, 21_1, 21_2, and 21_3 for portions respectively corresponding to the string units SU0 to SU3.

In the hookup areas HA1 and HA2, which are described later, the semiconductor layers 21_0 to 21_3 of each layer L are electrically coupled to the corresponding bit line BL. Specifically, the semiconductor layers 21_0 to 21_3 of the layer L0 are electrically coupled to the bit lines BL0, BL4, BL8, and BL12, respectively. The semiconductor layers 21_0 to 21_3 of the layer L1 are electrically coupled to the bit lines BL1, BL5, BL9, and BL13, respectively. The semiconductor layers 21_0 to 21_3 of the layer L2 are electrically coupled to the bit lines BL2, BL6, BL10, and BL14, respectively. The semiconductor layers 21_0 to 21_3 of the layer L3 are electrically coupled to the bit lines BL3, BL7, BL11, and BL15, respectively.

An insulating layer 31 is provided on the upper surface of the semiconductor layer 21. The insulating layer 31 includes, for example, silicon oxide.

The insulating layer 33 is provided above the insulating layer 31. The insulating layer 33 includes, for example, silicon oxide.

The conductive layer 22 and the stacked film 32 are provided between the insulating layer 31 and the insulating layer 33. The conductive layer 22 contains tungsten, for example. As described above, the conductive layer 22 is divided for each string unit SU by the insulating films 50 and 51. Therefore, the conductive layer 22 of each layer L is divided into conductive layers 22_0, 22_1, 22_2, and 22_3 for each portion corresponding to string units SU0 to SU3.

The conductive layers 22_0 to 22_3 of each layer L are electrically coupled to the same word line WL in the hookup areas HA1 and HA2 described later. Specifically, the conductive layers 22_0 to 22_3 of the layer L0 are electrically coupled to the word line WL0. The conductive layers 22_0 to 22_3 of the layer L1 are electrically coupled to the word line WL1. The conductive layers 22_0 to 22_3 of the layer L2 are electrically coupled to word line WL2. The conductive layers 22_0 to 22_3 of the layer L3 are electrically coupled to the word line WL3.

The stacked film 32 covers the conductive layer 22. In particular, the block insulating film 32c is provided on the conductive layer 22. The block insulating film 32c includes, for example, silicon oxide.

A charge storage film 32c is provided on the block insulating film 32b. The charge storage film 32b includes, for example, silicon nitride.

A tunnel insulating film 32a is provided on the charge storage film 32b. The tunnel insulating film 32a includes, for example, silicon oxide. A portion of the tunnel insulating film 32a below the conductive layer 22 is in contact with the insulating layer 31. A portion of the tunnel insulating film 32a above the conductive layer 22 is in contact with the insulating layer 33. A portion of the tunnel insulating film 32a at the same height as the conductive layer 22 is in contact with the semiconductor film 40.

Figure 6:
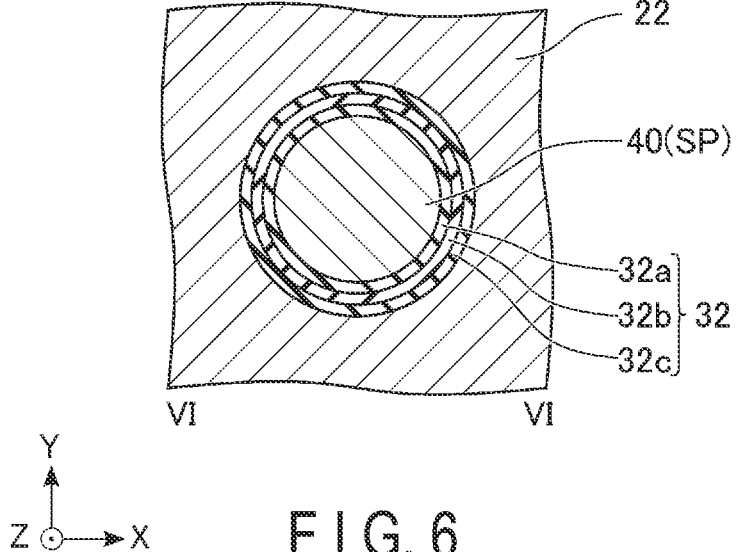
FIG. 6 is a cross-sectional view taken along line VI-VI of FIG. 5, showing an example of a cross-sectional structure of a memory cell transistor included in the memory cell array according to the embodiment.

FIG. 6 is a cross-sectional view taken along line VI-VI of FIG. 5, illustrating an example of a cross-sectional structure of the stacked interconnect structure and the source pillar according to the embodiment. Specifically, FIG. 6 shows a cross-sectional structure of the stacked interconnect structure LS and the source pillar SP in a layer parallel to the surface of the semiconductor substrate 20 and including the conductive layer 22.

In the cross section including the conductive layer 22, the tunnel insulating film 32a surrounds the side surface of the semiconductor film 40. The charge storage film 32b surrounds the side surface of the tunnel insulating film 32a. The block insulating film 32c surrounds the side surface of the charge storage film 32b. The conductive layer 22 surrounds the side surface of the block insulating film 32c. As described above, the diameter of the semiconductor film 40 is shorter than the width of the stacked wiring structure LS along the Y direction between two members SLTb or between the member SLTa and the member SLTb.

The layers L0 to L3 having the above-described configuration are stacked in this order in the Z direction, thereby forming the stacked interconnect structure LS. Portions where the semiconductor film 40 and the layers L0 to L3 of the stacked interconnect structure LS intersect each other function as the memory cell transistors MT0 to MT3, respectively. Specifically, portions of the semiconductor film 40 intersecting the conductive layers 22 and the stacked films 32 of the layers L0 to L3 function as channels of the memory cell transistors MT0 to MT3, respectively. Portions of the semiconductor film 40 intersecting the semiconductor layers 21 and the insulating layers 31 of the layers L0 to L3 function as first ends of the memory cell transistors MT0 to MT3, respectively. Portions of the semiconductor film 40 intersecting the insulating layers 33 function as second ends of the memory cell transistors MT0 to MT3, respectively. The threshold voltage of the corresponding memory cell transistors MT changes in accordance with the charges stored in the charge storage films 32b. Thus, each memory cell transistor MT can store data. That is, the charge storage film 32b functions as a memory film of the corresponding memory cell transistor MT.

1.4.3 Hookup Area

Next, a configuration of the hookup area of the memory cell array according to the embodiment is described.

1.4.3.1 Planar Layout

In the memory cell array according to the embodiment, the structure of the block BLK in the hookup area HA1 and the structure of the block BLK in the hookup area HA2 are similar. In more concrete terms, for example, the planar layout of the block BLK in the hookup area HA1 has a planar layout similar to a reverse planar layout of the block BLK in the hookup area HA2 in which the structures of the block BLK are turned over in each of the X and Y directions. Hereinafter, a planar layout of the block BLK in the hookup area HA1 is described.

Figure 7:
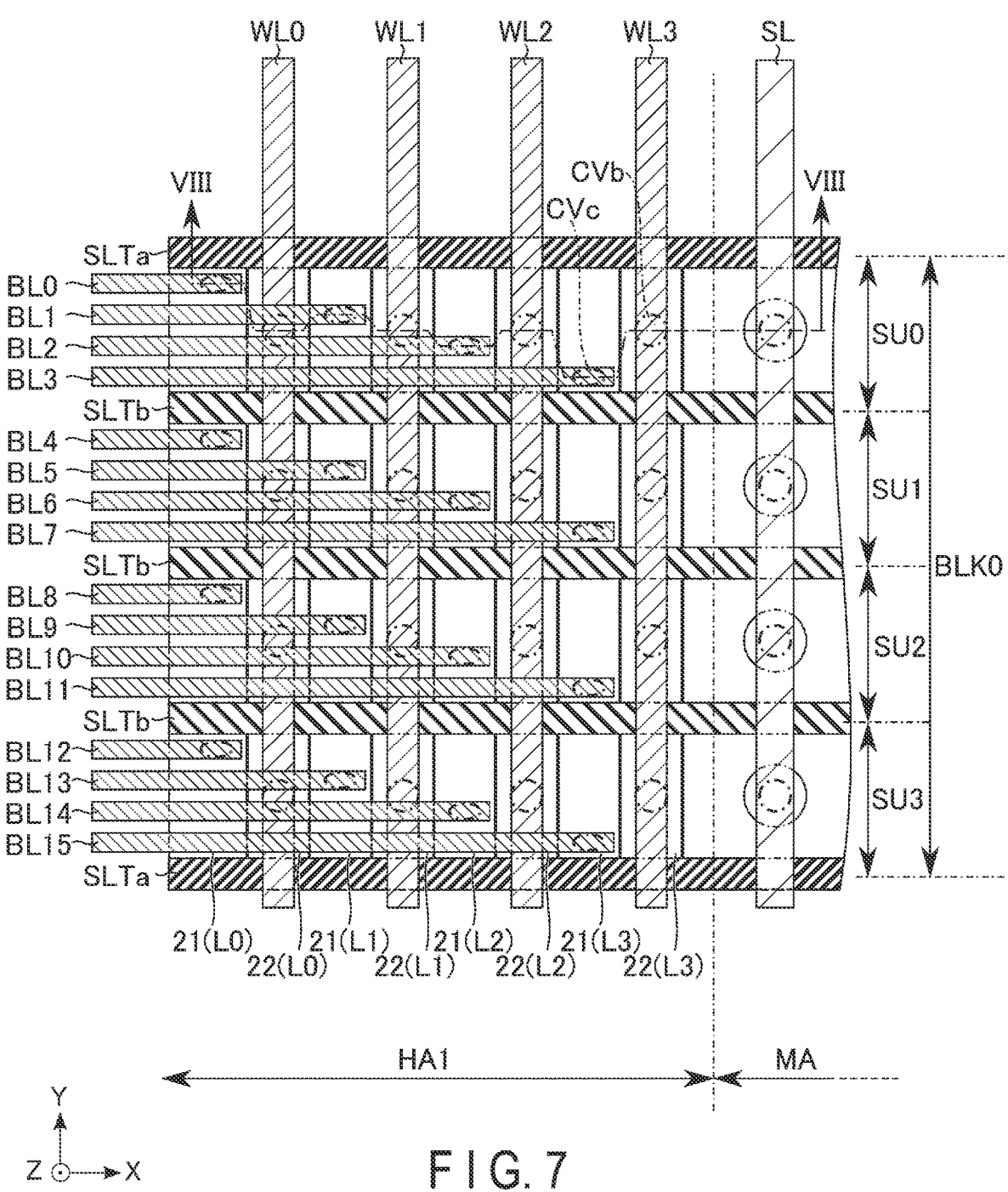
FIG. 7 is a plan view showing an example of a planar layout in a hookup area of the memory cell array according to the embodiment.

FIG. 7 is a plan view showing an example of a detailed planar layout in the hookup area of the memory cell array according to the embodiment. What is shown in FIG. 7 covers an area corresponding to the block BLK0 in the hookup area HA1, and also a part of the nearby memory area MA.

In the hookup area HA1, each of the plurality of word lines WL and the plurality of bit lines BL has a portion (terrace portion) which does not overlap with the upper interconnect layer (the semiconductor layer 21 and the conductive layer 22) of the stacked interconnect structure LS. In the hookup area HA1, the memory cell array 16 includes the plurality of contacts CVb and CVc, the plurality of word lines WL0 to WL3, and the plurality of bit lines BL0 to BL15.

The shape of the terrace portion is similar to a step, a terrace, a rimstone, or the like. Specifically, a step is provided between each of the semiconductor layer 21 of the layer L0, the conductive layer 22 of the layer L0, the semiconductor layer 21 of the layer L1, the conductive layer 22 of the layer L1, the semiconductor layer 21 of the layer L2, the conductive layer 22 of the layer L2, the semiconductor layer 21 of the layer L3, and the conductive layer 22 of the layer L3. In the example of FIG. 7, the above-described steps are provided in a stepwise manner along the X direction.

The plurality of contacts CVb are provided on the upper surfaces of the terrace portions of the conductive layers 22_0 to 22_3 of the layers L0 to L3, respectively. The plurality of contacts CVb corresponding to the conductive layers 22_0 to 22_3 of the layer L0 are commonly coupled to word line WL0. The plurality of contacts CVb corresponding to the conductive layers 22_0 to 22_3 of the layer L1 are commonly coupled to the word line WL1. The plurality of contacts CVb corresponding to the conductive layers 22_0 to 22_3 of the layer L2 are commonly coupled to the word line WL2. The plurality of contacts CVb corresponding to the conductive layers 22_0 to 22_3 of the layer L3 are commonly coupled to the word line WL3. The plurality of word lines WL are arranged in the X direction. Each word line WL extends in the Y direction.

In addition, the plurality of contacts CVc are provided on the upper surfaces of the terrace portions of the semiconductor layers 21_0 to 21_3 of the layers L0 to L3. The plurality of contacts CVc corresponding to the semiconductor layer 21_0 of each of the layers L0 to L3 are coupled to the bit lines BL0 to BL3, respectively. The plurality of contacts CVc corresponding to the semiconductor layer 21_1 of each of the layers L0 to L3 are coupled to the bit lines BL4 to BL7, respectively. The plurality of contacts CVc corresponding to the semiconductor layer 21_2 of each of the layers L0 to L3 are coupled to the bit lines BL8 to BL11, respectively. The plurality of contacts CVc corresponding to the semiconductor layer 21_3 of the layers L0 to L3 are coupled to the bit lines BL12 to BL15, respectively. The plurality of bit lines BL are arranged in the Y direction. Each bit line BL extends in the X direction.

1.4.3.2 Cross-Sectional Structure

FIG. 8 is a cross-sectional view taken along line VIII-VIII of FIG. 7, showing an example of a cross-sectional structure in the hookup area of the memory cell array according to the embodiment. That is, FIG. 8 illustrates a cross-sectional structure of the string unit SU0 along the XZ plane. As shown in FIG. 8, the memory cell array 16 in its hookup area HA1 further includes a plurality of conductive layers 43 to 46.

The plurality of conductive layers 43 are provided on the upper surfaces of the terrace portions of the conductive layers 22 of the layers L0 to L3, respectively. Each of the conductive layers 43 is used as a contact CVb.

The plurality of conductive layers 44 are provided on the upper surfaces of the plurality of conductive layers 43 corresponding to the layers L0 to L3, respectively. The plurality of conductive layers 44 corresponding to the layers L0 to L3 are used as the word lines WL0 to WL3, respectively.

The plurality of conductive layers 45 are provided on the upper surfaces of the terrace portions of the semiconductor layers 21 of the layers L0 to L3, respectively. Each of the conductive layers 45 is used as a contact CVc.

The plurality of conductive layers 46 are provided on the upper surfaces of the plurality of conductive layers 45 corresponding to the layers L0 to L3, respectively. The plurality of conductive layers 46 corresponding to the layers L0 to L3 of the string unit SU0 are used as the bit lines BL0 to BL3, respectively.

Although not shown in FIG. 8, the plurality of conductive layers 46 corresponding to the layers L0 to L3 of the string unit SU1 are used as the bit lines BL4 to BL7, respectively. The plurality of conductive layers 46 corresponding to the layers L0 to L3 of the string unit SU2 are used as the bit lines BL8 to BL11, respectively. The plurality of conductive layers 46 corresponding to the layers L0 to L3 of the string unit SU3 are used as the bit lines BL12 to BL15, respectively.

2. Operation

2.1 Write Operation

A write operation in the memory device according to the embodiment is described.

FIG. 9 is a circuit diagram showing an example of a write operation in the memory device according to the embodiment. FIG. 9 illustrates an example of voltages applied to the word lines WL, the bit lines BL, and the source line SL in a case where the memory cell transistor MT1 of the NOR string NS1 of the string unit SU2 is set as a write target. That is, FIG. 9 shows a case where the selected word line WL, the selected bit line BL, and the selected source line SL for specifying a write target are WL1, BL9, and SL1, respectively.

As shown in FIG. 9, the voltage VPGM is applied to the selected word line WL1. The voltage VPGM is a high voltage that can inject charges into the charge storage film 32*b* of the memory cell transistor MT. The voltage VPGM is, for example, 12V. The voltage VPGM turns on the memory cell transistor MT regardless of whether data is written. Note that, for example, a channel hot electron (CHE) method is applied to the injection of the charges into the memory cell transistor MT.

The voltage VPASS is applied to all word lines WL coupled to the memory cell transistors MT closer to the source side than the write target (the non-selected word lines WL2 and WL3). The voltage VPASS turns on the memory cell transistor MT regardless of whether data is written. The voltage VPASS is a voltage at which charges are not injected into the charge storage film 32*b* of the memory cell transistor MT. In other words, the voltage VPASS is lower than the voltage VPGM. The voltage VPASS is, for example, 5 V.

The voltage VSS is applied to all word lines WL (non-selected word line WL0) coupled to the memory cell transistors MT closer to the drain side than the write target. The voltage VSS is a ground voltage. The voltage VSS is, for example, 0 V.

The voltage VSS is applied to the selected source line SL1.

The voltage VS1 is applied to all source lines SL other than the selected source line SL1 (the non-selected source lines SL0 and SL2 to SLm). The voltage VS1 is a voltage for reducing the source-drain voltage of all memory cell transistors MT coupled to the non-selected source lines SL0 and SL2 to SLm. The voltage VS1 is adjusted so as not to cause unintended injection of charges into the memory cell transistor MT. The voltage VS1 is, for example, not less than 3 V and not more than 5 V.

The voltage VD1 is applied to the selected bit line BL9. The voltage VD1 is, for example, 8 V. Thus, a potential difference |VD1−VSS|=8 V is applied between the source and the drain of the write target. Charges can thus be injected into the charge storage film 32*b* of the write target. On the other hand, a potential difference |VD1−VS1|=3 to 5 V is applied between the source and the drain of all memory cell transistors MT1 which are not the write target and are coupled to the selected bit line BL9. In this way, the potential difference |VD1−VS1| is reduced with respect to the potential difference |VD1−VSS|, and thus, the injection of charges is suppressed in all memory cell transistors MT1 which are not the write target and are coupled to the selected bit line BL9.

The voltage VSS is applied to the bit lines BL other than the selected bit line BL9 in the layer L1 (the non-selected bit lines BL1, BL5, and BL13). In this way, the potential difference |VSS−VSS|=0 V is applied between the source and the drain of all memory cell transistors MT1 coupled to the selected source line SL1 and the non-selected bit line BL1, BL5, or BL13. In this way, the injection of charges is suppressed in all memory cell transistors MT1 coupled to the selected source line SL1 and the non-selected bit line BL1, BL5, or BL13. In addition, a potential difference |VS1−VSS|=3 to 5 V is applied between the source and the drain of all memory cell transistors MT1 coupled to the non-selected source line SL and the non-selected bit line BL1, BL5, or BL13. In this way, the potential difference |VS1−VSS| is reduced with respect to the potential difference |VD1−VSS|, and thus, the injection of charges is suppressed in all memory cell transistors MT1 which are coupled to the non-selected source line SL and the selected bit line BL1, BL5, or BL13.

A voltage not less than VSS and not more than VS1 is applied to all non-selected bit lines (bit lines BL0, BL2 to BL4, BL6 to BL8, BL10 to BL12, BL14, and BL15) in the layers L0, L2, and L3. Alternatively, the non-selected bit lines BL0, BL2 to BL4, BL6 to BL8, BL10 to BL12, BL14, and BL15 may be set to an open state. Thus, the voltage between the source and the drain of the memory cell transistor MT which is not a write target is suppressed from becoming an unintended height.

2.2 Read Operation

Next, a read operation in the memory device according to the embodiment is described.

FIG. 10 is a circuit diagram showing an example of a read operation in the memory device according to the embodiment. FIG. 10 illustrates an example of voltages applied to the word line WL, the bit line BL, and the source line SL in a case where the memory cell transistor MT1 of the NOR string NS1 of the string unit SU2 is set as a read target. That is, FIG. 10 shows a case where the selected word line WL, the selected bit line BL, and the selected source line SL for specifying the read target are WL1, BL9, and SL1, respectively, similarly to FIG. 9.

As shown in FIG. 10, the voltage VCGR is applied to the selected word line WL1. The voltage VCGR is a voltage that turns the memory cell transistor MT to an off state if data is written, and turns the memory cell transistor MT to an on state if data is not written.

The voltage VREAD is applied to all word lines WL coupled to the memory cell transistors MT closer to the source side than the read target (the non-selected word lines WL2 and WL3). The voltage VREAD turns the memory cell transistor MT to an on state regardless of whether data is written. The voltage VREAD is, for example, 5 V.

The voltage VSS is applied to all word lines WL (non-selected word line WL0) coupled to the memory cell transistors MT closer to the source side than the read target.

The voltage VSS is applied to selected source line SL1.

The voltage VS2 is applied to all source lines SL other than the selected source line SL1 (the non-selected source lines SL0 and SL2 to SLm). The voltage VS2 is, for example, 1 V.

The voltage VS2 is applied to selected bit line BL9. Thus, a potential difference |VS2−VSS|=1 V is applied between the source and the drain of the write target. Therefore, if data is not written in the read target, a read current corresponding to the potential difference |VS2−VSS| can be supplied. If data is written in the read target, no read current flows in the read target. On the other hand, a potential difference |VS2−VS2|=0 V is applied between the source and the drain of all memory cell transistors MT1 which are not the read target and are coupled to the selected bit line BL9. Thus, the current flowing through all memory cell transistors MT1 that are coupled to selected bit line BL9 and are not the read target is suppressed. Therefore, the sense amplifier module 18 can read the read target based on the read current flowing through the bit line BL9.

The voltage VSS is applied to all bit lines BL other than the selected bit line BL9 (the non-selected bit lines BL0 to BL8 and BL10 to BL13). In this way, the potential difference |VS2−VSS|=1 V is applied between the source and the drain of all memory cell transistors MT coupled to the non-selected source lines BL0 to BL8 and BL10 to BL13. Therefore, a current may flow through the non-selected bit lines BL0 to BL8 and BL10 to BL13. However, since the current flowing through the non-selected bit lines BL0 to BL8 and BL10 to BL13 is independent of the read current flowing to the read target via the selected bit line BL9, the current can be ignored in a read operation.

2.3 Erase Operation

Next, an erase operation in the memory device according to the embodiment is described.

2.3.1 First Example

FIG. 11 is a circuit diagram showing an example of an erase operation in the memory device according to the embodiment. FIG. 11 illustrates an example of voltages applied to the word line WL, the bit line BL, and the source line SL in a case where memory cell transistor MT1 of the NOR string NS1 of the string unit SU0 is set as an erase target. In other words, FIG. 11 shows a case where the selected word line WL and the selected source line SL for specifying an erase target are WL1 and SL1, respectively.

As shown in FIG. 11, the voltage VSS is applied to the selected word line WL1. The voltage VERA is applied to all word lines WL other than the selected word line WL1 (non-selected word lines WL0, WL2, and WL3). The voltage VERA is, for example, 12 V. The unselected word lines WL0, WL2, and WL3 may be in an open state.

The voltage VERA is applied to selected source line SL1. The voltage VSS is applied to all source lines SL other than the selected source line SL (the non-selected source lines SL0 and SL2 to SLm).

All bit lines BL0 to BL15 are set to an open state. Thereby, Fowler-Nordheim (FN) tunneling can be generated in the memory cell transistor MT1 of the NOR string NS1 of each string unit SU. Therefore, electrons can be extracted from the charge storage films 32b of the four memory cell transistors MT to be erased.

2.3.2 Second Example

FIG. 12 is a circuit diagram showing a second example of the erase operation in the memory device according to the embodiment. FIG. 12 illustrates an example of voltages applied to the word line WL, the bit line BL, and the source line SL when one block BLK is set as an erase target.

As shown in FIG. 12, the voltage VSS is applied to all word lines WL0 to WL3. The voltage VERA is applied to all source lines SL0 to SLm. All bit lines BL0 to BL15 are set to an open state. Thus, FN tunneling can be generated in all memory cell transistors MT in one block BLK. Therefore, electrons can be extracted from the charge storage films 32b of all memory cell transistors MT in the block BLK to be erased.

3. Manufacturing Method

FIGS. 13 to 19 each illustrate an example of a cross-sectional structure of the memory cell array according to the embodiment during manufacturing. The cross-sectional structures illustrated in FIGS. 13 to 16 show regions corresponding to FIG. 8. The cross-sectional structures illustrated in FIGS. 17 to 19 show regions corresponding to FIG. 5. An example of a manufacturing process of the stacked wiring structure in the memory cell array 16 in the memory device 3 is described hereinafter.

First, as shown in FIG. 13, a stacked structure including the sacrificial member SM is formed. Specifically, the insulating layer 30 is formed on the semiconductor substrate 20. The multilayer structure corresponding to the layers L0 to L3 is stacked on the insulating layer 30 in this order. Each of the portions corresponding to the layers L0 to L3 of the stacked structure is formed by stacking the semiconductor layer 21, the insulating layer 31, the sacrificial member SM, and the insulating layer 33 in this order.

Then, as shown in FIG. 14, the end portions of the stacked semiconductor layer 21 and the sacrificial member SM are processed into a stepped shape in the hookup areas HA1 and HA2. Thereafter, the stepped portions in the hookup areas HA1 and HA2 are filled with the insulating layer INS. The upper surface of the stacked structure is planarized by, for example, chemical mechanical polishing (CMP).

Then, a mask having an opening in a region corresponding to the source pillar SP is formed by photolithography or the like. Then, as shown in FIG. 15, holes H1 penetrating the stacked structure is formed by anisotropic etching using the mask. For example, the insulating layer 30 is exposed at the bottom of the holes H1. Each of the holes H1 corresponds to the source pillar SP. For example, RIE (Reactive Ion Etching) is used for forming the holes H1 in this step.

As shown in FIG. 16, each of the holes H1 is filled with the semiconductor film 40. The upper surface of each of the holes H1 is exposed by removing the upper surface of the stacked structure by, for example, CMP. Thereafter, an N-type impurity is implanted into the upper portion of the semiconductor film 40. Thereby, the semiconductor portion 40a is formed.

Next, as shown in FIG. 17, a plurality of slits H2 are formed. Specifically, first, a mask in which regions corresponding to the members SLTa and SLTb are opened is formed by photolithography or the like. Then, for example, slits H2 penetrating the stacked structure are formed by anisotropic etching using the mask. Thereby, the stacked structure is divided for each structure corresponding to the string unit SU. For example, RIE is used for forming the slits H2 in this step.

Next, a replacement process of the sacrificial member SM in the stacked structure is performed. To be specific, as shown in FIG. 18, first, the sacrificial member SM is selectively removed via the slits H2 by wet etching using hot phosphoric acid or the like. The stacked structure from which the sacrificial member SM is removed is supported by the plurality of source pillars SP.

Then, as shown in FIG. 19, the tunnel insulating film 32a, the charge storage film 32b, the block insulating film 32c, and a conductor are embedded in this order in the space from which the sacrificial member SM has been removed, via the slits H2. For example, CVD (Chemical Vapor Deposition) is used for forming the stacked film 32 and the conductor in this step. Thereafter, at least the conductor of the stacked film 32 and the conductor formed inside the slits H2 is removed by the etch-back process. Thus, the conductors adjacent to each other in the Z direction are separated into the plurality of conductive layers 22 for each layer L. The plurality of conductive layers 22 separated for each layer L function as wires corresponding to the word lines WL0 to WL3, respectively. The conductive layer 22 formed in this step may contain a barrier metal. In this case, in the formation of the conductor after the formation of the stacked film 32, for example, titanium nitride is formed as a barrier metal, and then tungsten is formed.

Thereafter, the slits H2 are filled with the insulating films 50 and 51. The insulating films 50 and 51 function as members SLTa and SLTb, respectively.

The stacked wiring structure in the memory cell array 16 is formed by the manufacturing process described above. The manufacturing process described above is merely an example, and the present invention is not limited thereto. For example, other processes may be inserted between the manufacturing processes, or some of the processes may be omitted or integrated. The manufacturing steps may be interchanged as much as possible.

4. Effects of Embodiment

According to the embodiment, the integration degree of the memory can be improved. This effect is described hereinafter.

Each layer L of the stacked wiring structure LS includes a semiconductor layer 21 and a conductive layer 22 provided apart from each other in the Z direction. A block insulating film 32c is provided so as to cover the conductive layer 22. A charge storage film 32b is provided so as to cover the block insulating film 32c. A tunnel insulating film 32a is provided so as to cover the charge storage film 32c. A semiconductor film 40 extending in the Z-direction is provided so as to penetrate the stacked wiring structure LS. The semiconductor film 40 is in contact with the semiconductor layer 21 and intersects the conductive layer 22 in each layer L. Thus, a portion where the semiconductor film 40 and each layer L intersect can function as the memory cell transistor MT. Therefore, the memory cell transistors MT can be stacked in the Z direction. Therefore, the capacity of the memory can be increased while suppressing an increase in the chip size.

In such a configuration, the first end of the memory cell transistor MT0 is electrically coupled to, for example, the bit line BL0. A first end of the memory cell transistor MT1 and a second end of the memory cell transistor MT0 are electrically coupled to, for example, the bit line BL1. A first end of the memory cell transistor MT2 and a second end of the memory cell transistor MT1 are electrically coupled to, for example, the bit line BL2. A first end of the memory cell transistor MT3 and a second end of the memory cell transistor MT2 are electrically coupled to, for example, the bit line BL3. The second end of the memory cell transistor MT3 is electrically coupled to the source line SL. Thus, the write operation and the read operation can be individually performed on each memory cell transistor MT. That is, the memory device 3 can operate as a NOR flash memory.

The memory cell array 16 is mainly configured by a stacked wiring structure and a pillar penetrating the stacked wiring structure. Such a structure is similar to the structure of a memory cell array of a NAND flash memory. Thus, the memory device according to the present embodiment can be manufactured while using the manufacturing technique of the NAND flash memory. Therefore, it is possible to suppress an increase in the manufacturing load of the memory device 3.

5. Modifications

The embodiment is not limited to the above-described example, and various modifications can be applied.

For example, in the above-described embodiments, the case where the memory cell transistor MT stores the information by the change in threshold voltage according to the accumulation of the charges in the charge storage film 32b has been described. For example, the memory cell transistor MT may store data by a change in threshold voltage according to a change in the polarization direction of the ferroelectric substance.

FIG. 20 is a cross-sectional view showing an example of a cross-sectional structure of a memory cell array according to a modification. FIG. 20 corresponds to FIG. 5 in the embodiment. As shown in FIG. 20, in the memory region MA, the memory cell array 16 includes a stacked film 32A instead of the stacked film 32. The stacked film 32A includes a gate insulating film 32d and a ferroelectric film 32e.

The stacked film 32A covers the conductive layer 22. In particular, the ferroelectric film 32e is provided on the conductive layer 22. The ferroelectric film 32e includes, for example, a perovskite-based ferroelectric material or an organic polymer ferroelectric material. The perovskite-based ferroelectric material includes, for example, at least one of lead zirconate titanate (PZT) and strontium tantalate bismuthate (SBT). The organic polymer ferroelectric material includes, for example, polyvinylidene fluoride-trifluoroethylene (P (VDF-TrFE)).

A gate insulating film 32d is provided on the ferroelectric film 32e. The gate insulating film 32d includes, for example, silicon oxide. A portion of the gate insulating film 32d below the conductive layer 22 is in contact with the insulating layer 31. A portion of the gate insulating film 32d above the conductive layer 22 is in contact with the insulating layer 33. A portion of the gate insulating film 32d that is at the same height as the conductive layer 22 is in contact with the semiconductor film 40.

As described above, the ferroelectric film 32e is used as the memory film of the memory cell transistor MT, and thus the memory cell transistor MT can function as a ferroelectric field effect transistor (FEFET). That is, the memory device 3 can function as a ferroelectric random access memory (FeRAM).

Note that, although the case where the stacked film 32A includes the gate insulating film 32d has been described with reference to FIG. 20, the present invention is not limited thereto. For example, the stacked film 32A may be formed of only the ferroelectric film 32e.

In the above-described embodiment and modification, the case where the source pillar SP contains the N-type impurity at a concentration lower than that of the bit line BL has been described, but the present invention is not limited thereto. For example, the source pillar SP may not contain an impurity (may be non-doped). Further, for example, the source pillar SP may contain a P-type impurity such as boron (B) from the viewpoint of threshold voltage adjustment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. These embodiments and modifications thereof are included in the scope and spirit of the invention, and are included in the invention described in the claims and the scope of equivalents thereof.

What is claimed is:

1. A memory device comprising:
a first semiconductor layer, a first conductive layer, a second semiconductor layer, and a second conductive layer that are arranged in this order in a first direction, spaced apart from each other;
a first semiconductor film extending in the first direction, being in contact with the first semiconductor layer and the second semiconductor layer, and intersecting the first conductive layer and the second conductive layer;
a first memory film provided between the first conductive layer and the first semiconductor film; and
a second memory film provided between the second conductive layer and the first semiconductor film.

2. The memory device according to claim 1, wherein the first memory film and the second memory film are a charge storage film.

3. The memory device according to claim 2, wherein the charge storage film includes silicon nitride.

4. The memory device according to claim 1, wherein the first memory film and the second memory film are a ferroelectric film.

5. The memory device according to claim 4, wherein the ferroelectric film includes at least one material selected from lead zirconate titanate, strontium tantalate bismuthate, and polyvinylidene fluoride-trifluoroethylene (P(VDF-TrFE)).

6. The memory device according to claim 1, wherein the first semiconductor layer and the second semiconductor layer contain an N-type impurity.

7. The memory device according to claim 6, wherein the first semiconductor film contains an N-type impurity.

8. The memory device according to claim 7, wherein a concentration of the N-type impurity contained in the first semiconductor layer and the second semiconductor layer is equal to or higher than a concentration of the N-type impurity contained in the first semiconductor film.

9. The memory device according to claim 6, wherein the first semiconductor film contains a P-type impurity.

10. The memory device according to claim 1, wherein each of the first semiconductor layer, the first conductive layer, the second semiconductor layer, and the second conductive layer surrounds the first semiconductor film when viewed in the first direction.

11. The memory device according to claim 1, further comprising:
a second semiconductor film extending in the first direction, being in contact with the first semiconductor layer and the second semiconductor layer, intersecting the first conductive layer and the second conductive layer, and provided apart from the first semiconductor film.

12. The memory device according to claim 1, further comprising:
a third semiconductor layer, a third conductive layer, a fourth semiconductor layer, and a fourth conductive layer that are arranged in this order in the first direction, spaced apart from each other;
an insulating film extending in the first direction and provided between the first semiconductor layer and the third semiconductor layer, between the first conductive layer and the third conductive layer, between the second semiconductor layer and the fourth semiconductor layer, and between the second conductive layer and the fourth conductive layer;
a third semiconductor film extending in the first direction, being in contact with the third semiconductor layer and the fourth semiconductor layer, and intersecting the third conductive layer and the fourth conductive layer;
a third memory film provided between the third conductive layer and the third semiconductor film; and
a fourth memory film provided between the fourth conductive layer and the third semiconductor film.

13. A memory device comprising:
a first memory cell transistor and a second memory cell transistor coupled in series;
a first source line electrically coupled to a first end of the first memory cell transistor;
a first bit line electrically coupled to a second end of the first memory cell transistor and a first end of the second memory cell transistor;
a second bit line electrically coupled to a second end of the second memory cell transistor;
a first word line electrically coupled to a gate of the first memory cell transistor; and
a second word line electrically coupled to a gate of the second memory cell transistor.

14. The memory device according to claim 13, further comprising:
a third memory cell transistor and a fourth memory cell transistor coupled in series;
a third bit line electrically coupled to a second end of the third memory cell transistor and a first end of the fourth memory cell transistor; and
a fourth bit line electrically coupled to a second end of the fourth memory cell transistor,
wherein
a first end of the third memory cell transistor is electrically coupled to the first source line,
a gate of the third memory cell transistor is electrically coupled to the first word line, and
a gate of the fourth memory cell transistor is electrically coupled to the second word line.

15. The memory device according to claim 13, further comprising:
a fifth memory cell transistor and a sixth memory cell transistor coupled in series; and
a second source line electrically coupled to a first end of the fifth memory cell transistor,
wherein
a second end of the fifth memory cell transistor and a first end of the sixth memory cell transistor are electrically coupled to the first bit line;
a second end of the sixth memory cell transistor is electrically coupled to the second bit line,
a gate of the fifth memory cell transistor is electrically coupled to the first word line, and
a gate of the sixth memory cell transistor is electrically coupled to the second word line.

16. The memory device according to claim 13, further comprising:
a seventh memory cell transistor having a first end coupled in series to the second end of the second memory cell transistor;
a fifth bit line electrically coupled to a second end of the seventh memory cell transistor; and
a third word line electrically coupled to a gate of the seventh memory cell transistor, wherein in a write operation on the second memory cell transistor, the memory device is configured to:

apply a first voltage to the first word line;

apply a second voltage higher than the first voltage to the second word line; and apply a third voltage lower than the first voltage to the third word line, in a write operation on the seventh memory cell transistor, the memory device is configured to:

apply the first voltage to the first word line and the second word line; and apply the second voltage to the third word line.

17. The memory device according to claim 13, further comprising:

a seventh memory cell transistor having a first end coupled in series to the second end of the second memory cell transistor;

a fifth bit line electrically coupled to a second end of the seventh memory cell transistor; and a third word line electrically coupled to a gate of the seventh memory cell transistor, wherein in a read operation on the second memory cell transistor, the memory device is configured to:

apply a fourth voltage to the first word line;

apply a fifth voltage lower than the fourth voltage to the second word line; and apply a sixth voltage lower than the fifth voltage to the third word line, in a read operation on the seventh memory cell transistor, apply the fourth voltage to the first word line and the second word line; and apply the fifth voltage to the third word line.

18. The memory device according to claim 13 configured to:

in an erase operation on the second memory cell transistor, apply a seventh voltage to the first source line;

set the first bit line and the second bit line to an open state;

apply the seventh voltage to the first word line or set the first word line to an open state; and apply an eighth voltage lower than the seventh voltage to the second word line.

19. The memory device according to claim 13 configured to:

in an erase operation on the first memory cell transistor and the second memory cell transistor, apply a seventh voltage to the first source line;

set the first bit line and the second bit line to an open state; and apply an eighth voltage lower than the seventh voltage to the first word line and the second word line.

* * * * *